(12) United States Patent
Inoue

(10) Patent No.: US 10,277,181 B2
(45) Date of Patent: Apr. 30, 2019

(54) SEMICONDUCTOR DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventor: Hiroki Inoue, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/685,079

(22) Filed: Aug. 24, 2017

(65) Prior Publication Data

US 2018/0069515 A1 Mar. 8, 2018

(30) Foreign Application Priority Data

Sep. 2, 2016 (JP) .................................. 2016-171508

(51) Int. Cl.
*H03F 3/45* (2006.01)
*G09G 5/00* (2006.01)
(Continued)

(52) U.S. Cl.
CPC ......... *H03F 3/45484* (2013.01); *G05F 3/262* (2013.01); *G09G 3/20* (2013.01);
(Continued)

(58) Field of Classification Search
CPC ..... H03F 3/45484; H03F 3/4508; G09G 3/20; G09G 3/36; G09G 5/006; G09G 2370/08;
(Continued)

(56) References Cited

U.S. PATENT DOCUMENTS 5,469,080 A * 11/1995 Son .................... H03K 19/0013
326/71
8,791,516 B2 * 7/2014 Ohshima ............. H01L 27/0605
257/296

(Continued)

OTHER PUBLICATIONS

Koo.K et al., "A New Level-Up Shifter for High Speed and Wide Range Interface in Ultra Deep Sub-Micron", ISCAS 2005 (IEEE International Symposium on Circuits and Systems), May 23, 2005, pp. 1063-1065, IEEE.

(Continued)

*Primary Examiner* — Jose R Soto Lopez
(74) *Attorney, Agent, or Firm* — Fish & Richardson P.C.

(57) ABSTRACT

To reduce power consumption and perform high-speed switching in boosting a voltage to a desired voltage. A semiconductor device includes a first buffer circuit, a level-shift circuit, and a second buffer circuit. The first buffer circuit includes a tri-state buffer circuit. The tri-state buffer circuit has a function of making each of an output of an input signal and an output of an inverted input signal into a resting state in response to a standby signal. The level-shift circuit includes a current mirror circuit, a differential amplifier circuit, and a switch circuit. The differential amplifier circuit has a function of controlling a current flowing through the current mirror circuit using the input signal and the inverted input signal as differential signals. The switch circuit has a function of making a current flowing through the differential amplifier circuit into a resting state in response to the standby signal.

18 Claims, 23 Drawing Sheets

(51) Int. Cl.
   *H03K 19/0185* (2006.01)
   *G05F 3/26* (2006.01)
   *H03K 19/003* (2006.01)
   *G09G 3/36* (2006.01)
   *G09G 3/20* (2006.01)
   *H03K 19/00* (2006.01)

(52) U.S. Cl.
   CPC .............. *G09G 3/36* (2013.01); *G09G 5/006* (2013.01); *H03F 3/4508* (2013.01); *H03K 19/003* (2013.01); *H03K 19/0016* (2013.01); *H03K 19/018507* (2013.01); *G09G 2370/08* (2013.01)

(58) Field of Classification Search
   CPC ....... H03K 19/0016; H03K 19/018507; H03K 19/003; G05F 3/262
   See application file for complete search history.

(56) References Cited

U.S. PATENT DOCUMENTS

| | | | |
|---|---|---|---|
| 9,570,445 | B2 | 2/2017 | Ohshima |
| 9,647,665 | B2 | 5/2017 | Inoue et al. |
| 9,830,877 | B2* | 11/2017 | Huang .................... G09G 3/36 |
| 2002/0050849 | A1* | 5/2002 | Hayashi ........... H03K 19/00323 327/333 |
| 2005/0151574 | A1* | 7/2005 | Lin ................ H03K 19/018521 327/333 |
| 2005/0205880 | A1* | 9/2005 | Anzai .................. G09G 3/3258 257/83 |
| 2006/0214686 | A1* | 9/2006 | Nakao .................. G09G 3/3685 326/81 |
| 2007/0171187 | A1* | 7/2007 | Saito ...................... G09G 3/344 345/107 |
| 2008/0197906 | A1* | 8/2008 | Mei .................... H03K 3/35613 327/333 |
| 2010/0073356 | A1* | 3/2010 | Tsujino ................ G09G 3/3677 345/214 |
| 2011/0234570 | A1* | 9/2011 | Tsuchi ................. G09G 3/3275 345/211 |
| 2016/0173097 | A1 | 6/2016 | Inoue et al. |
| 2016/0247477 | A1* | 8/2016 | Hu ........................... G09G 3/36 |
| 2016/0372028 | A1* | 12/2016 | Park ..................... G09G 3/2096 |

OTHER PUBLICATIONS

Joshi.T et al., "A Wide Range Level Shifter using a Self Biased Cascode Current Mirror with PTL based Buffer", NCETACT 2015 (National Conference on Emerging Trends in Advanced Communication Technologies), 2015, No. 5, pp. 8-12.

* cited by examiner

MV: Middle voltage device
LV: Low voltage device

MV: Middle voltage device
LV: Low voltage device

FIG. 7A
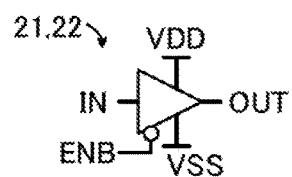
FIG. 7B
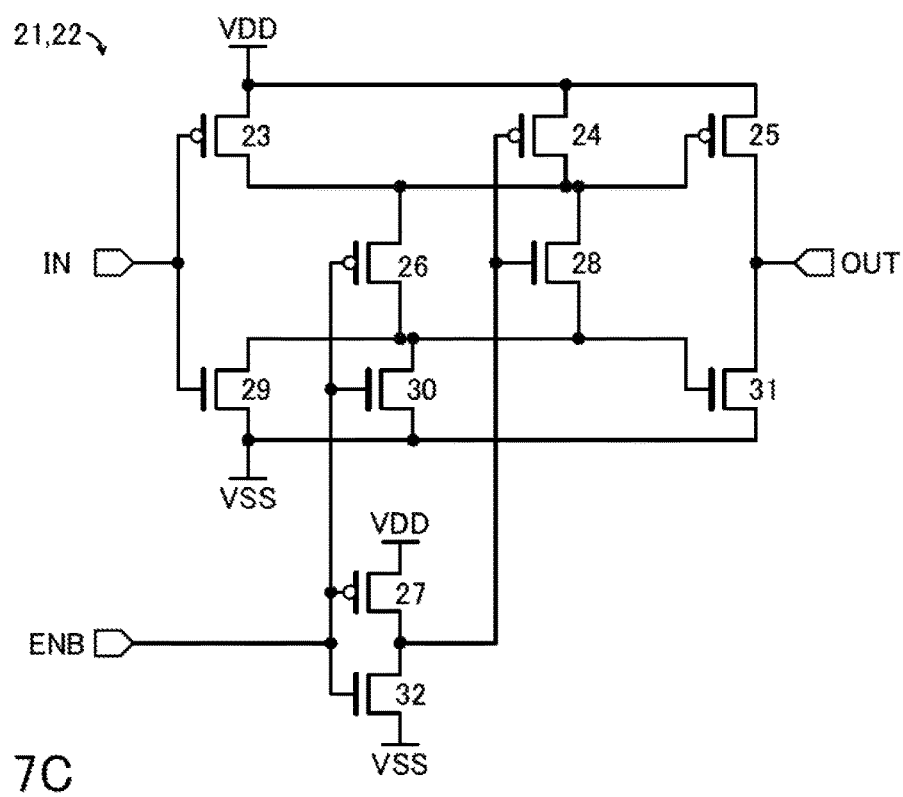
FIG. 7C
Truth table
| ENB | IN | OUT |
|---|---|---|
| 1 | 0 | Hi-Z |
| 1 | 1 | Hi-Z |
| 0 | 0 | 0 |
| 0 | 1 | 1 |

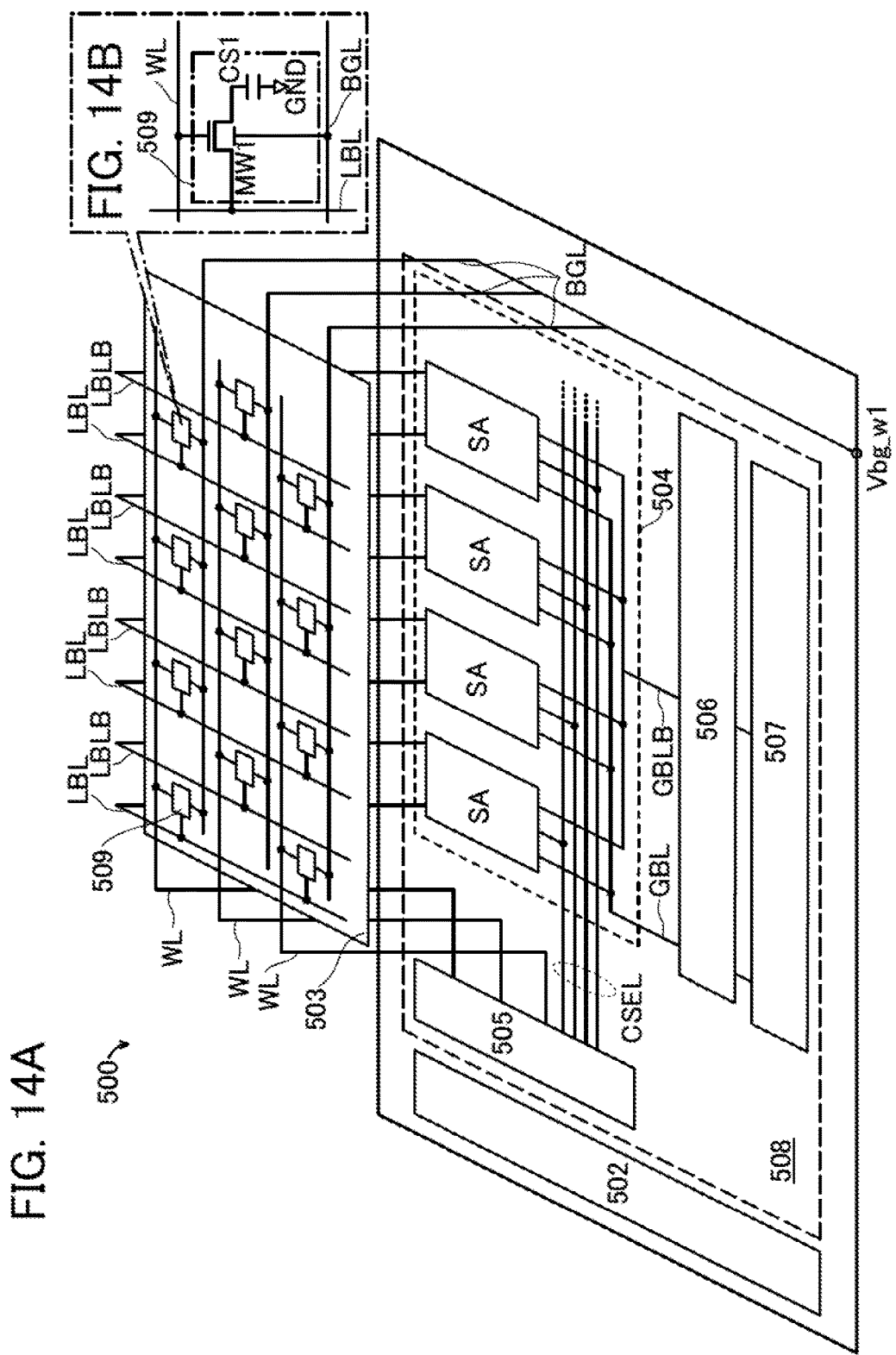

SEMICONDUCTOR DEVICE, DISPLAY MODULE, AND ELECTRONIC DEVICE

BACKGROUND OF THE INVENTION

1. Field of the Invention

One embodiment of the present invention relates to a semiconductor device, a display module, and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

Displays whose number of pixels is more than or equal to that of Full-HD have been widely used. In such displays, the amount of data per frame is extremely large. An interface circuit for transmitting data to the displays needs to achieve data transferring speed of 1 Gbps or more.

To achieve high data transferring speed, there is a method called a low voltage differential signaling (LVDS) in which a signal with small voltage amplitude is differentially transmitted. In LVDS, a receiver (RX) for receiving data and a transmitter (TX) for transmitting data are used. TX is a circuit for converting a single-ended input signal output from a low voltage (hereinafter referred to as LV) logic circuit to a differential current of ±3.5 mA and outputting the current.

The power supply voltage of the LV logic circuit is about 1.2 V and the driving voltage of a LV device such as a transistor included in the LV logic circuit is about 1.2 V. In contrast, the power supply voltage of the interface circuit such as TX or RX is about 3.3 V (hereinafter referred to as a middle voltage (MV)) and the driving voltage of an MV device such as a transistor included in the interface circuit is about 3.3 V. Thus, TX needs a level shift circuit for increasing a voltage from 1.2 V to 3.3 V (see Patent Document 1, for example).

As an example of the level shift circuit, a cross-coupled level shift circuit is given (see Patent Document 2, for example).

REFERENCE

Patent Document

[Patent Document 1] United States Published Patent Application No. 2008/0197906

[Patent Document 2] United States Patent Application Publication No. 2002/0050849

SUMMARY OF THE INVENTION

Since TX formed using MV devices needs to operate at high speed of several gigahertz or more, a level shift circuit also needs to operate at high speed of several gigahertz or more.

In a cross-coupled level shift circuit, a static consumption current is a leakage current between a source and a drain and a gate leak current and thus is small. However, since the cross-coupled level shift circuit is a latch type circuit which latches and outputs a signal corresponding to data, there is a problem in that the balance between a current flowing to a p-channel (pMOS) transistor and a current flowing to an n-channel (nMOS) transistor needs to be considered when data is inverted, which restricts an operation speed. Furthermore, when the balance between the current of the pMOS transistor and that of the nMOS transistor is taken into consideration, an increase in the layout area or the like becomes a problem because the ratio of the driving capacities of both transistors needs to be examined.

An object of one embodiment of the present invention is to provide a novel semiconductor device, a novel display module, a novel electronic device, and the like. Another object of one embodiment of the present invention is to provide a semiconductor device or the like with a novel structure, in which operation speed can be increased. Another object of one embodiment of the present invention is to provide a semiconductor device or the like with a novel structure that can reduce power consumption. Another object of one embodiment of the present invention is to provide a semiconductor device or the like with a novel structure in which the layout area can be reduced.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device including a first buffer circuit, a level-shift circuit, and a second buffer circuit. The first buffer circuit includes a tri-state buffer circuit. The tri-state buffer circuit has a function of making each of an output of an input signal and an output of an inverted input signal into a resting state in response to a standby signal. The level-shift circuit includes a current mirror circuit, a differential amplifier circuit, and a switch circuit. The differential amplifier circuit has a function of controlling a current flowing through the current mirror circuit using the input signal and the inverted input signal as differential signals. The switch circuit has a function of making a current flowing through the differential amplifier circuit into a resting state in response to the standby signal.

One embodiment of the present invention is preferably a semiconductor device in which the current mirror circuit includes p-channel transistors, and the differential amplifier circuit and the switch circuit include n-channel transistors.

One embodiment of the present invention is preferably a semiconductor device in which an amplitude voltage of the standby signal is smaller than an amplitude voltage of an output signal of the second buffer circuit.

One embodiment of the present invention is preferably a semiconductor device in which the standby signal includes a first standby signal and a second standby signal. The first standby signal is input to the tri-state buffer circuit. The second standby signal is input to the switch circuit. An amplitude voltage of the first standby signal is smaller than an amplitude voltage of the second standby signal.

One embodiment of the present invention is preferably a semiconductor device in which the second buffer circuit has a function of outputting an output signal generated by boosting the input signal in response to the current flowing through the current mirror circuit.

Note that other embodiments of the present invention will be described in the following embodiments with reference to the drawings.

One embodiment of the present invention can provide a novel semiconductor device, a novel display module, a novel electronic device, and the like.

Another object of one embodiment of the present invention can provide a semiconductor device or the like with a novel structure, in which operation speed can be increased. Another object of one embodiment of the present invention can provide a semiconductor device or the like with a novel structure that can reduce power consumption. Another object of one embodiment of the present invention can provide a semiconductor device or the like with a novel structure in which the layout area can be reduced.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Therefore, one embodiment of the present invention does not have the effects described above in some cases.

BRIEF DESCRIPTION OF THE DRAWINGS

FIGS. 7A to 7C are circuit diagrams and a truth table illustrating one embodiment of the present invention.

FIGS. 14A and 14B are a block diagram and a circuit diagram illustrating a configuration example of a DOSRAM.

DETAILED DESCRIPTION OF THE INVENTION

Figure 1A:
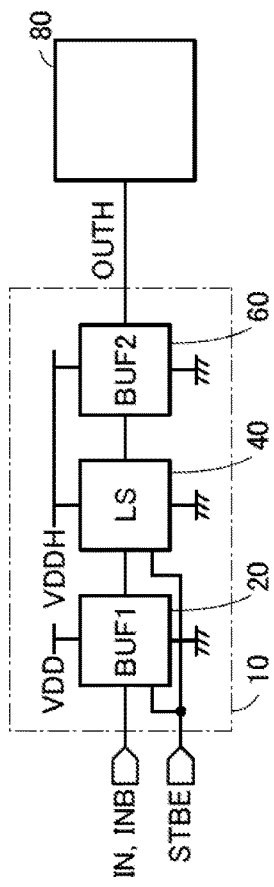
FIGS. 1A and 1B are a block diagram and a circuit diagram illustrating one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as "first", "second", and "third" are used in order to avoid confusion among components. Thus, the terms do not limit the number or order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

The same elements or elements having similar functions, elements formed using the same material, elements formed at the same time, or the like in the drawings are denoted by the same reference numerals, and the description thereof is not repeated in some cases.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is the case where one circuit is concerned with a plurality of functions or the case where a plurality of circuits are concerned with one function. Therefore, the segmentation of a block in the block diagram is not limited by any of the components described in the specification, and can be differently determined as appropriate depending on the situation.

In the drawings, the size, the layer thickness, or the region has arbitrary magnitude for convenience for the description. Therefore, embodiments of the present invention are not limited to such a scale. Note that the drawings are schematically illustrated for clarity, and shapes or values are not limited to those illustrated in the drawings. For example, the following can be included: variation in signal, voltage, or current due to noise or difference in timing.

In drawings such as plan views (also referred to as layout views) and perspective views, some of components might not be illustrated for clarity of the drawings.

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component. For example, an "electrode" is used as part of a "wiring" in some cases, and vice versa. Furthermore, the term "electrode" or "wiring" can also mean a combination of a plurality of "electrodes" or "wirings".

In this specification and the like, "voltage" and "potential" can be replaced with each other as appropriate. The term "voltage" refers to a potential difference from a reference potential. When the reference potential is a ground potential, for example, "voltage" can be replaced with "potential". The ground potential does not necessarily mean 0 V. Since a potential is a relative value, a potential supplied to a wiring or the like is changed depending on the reference potential in some cases.

In this specification and the like, the terms "film" and "layer" can be interchanged with each other depending on the situation or circumstances. For example, in some cases, the term "conductive film" can be used instead of the term "conductive layer," and the term "insulating layer" can be used instead of the term "insulating film".

In this specification and the like, a switch is turned on or off (brought into an on state or an off state) to determine whether current flows therethrough or not. Alternatively, a switch has a function of selecting and changing a current path.

For example, an electrical switch or a mechanical switch can be used. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, the "on state" of the transistor refers to a state in which a source and a drain of the transistor are electrically short-circuited. The "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical system (MEMS) technology, such as a digital micromirror device (DMD). Such a switch includes a mechanically movable electrode whose movement controls the on/off of the switch.

The channel length in this specification and the like refers to, for example, in a top view of a transistor, the distance between a source and a drain in a region in which a semiconductor (or a portion of the semiconductor in which current flows when the transistor is in an on state) and a gate electrode overlap with each other or in a region in which a channel is formed.

The channel length of a transistor is not necessarily constant in all regions. In other words, the channel length of a transistor is not limited to one value in some cases. Therefore, in this specification, the channel length is any one value, the maximum value, the minimum value, or the average value in a region in which a channel is formed.

In this specification and the like, the channel width refers to, for example, the length of a portion where a source and a drain face each other in a region where a semiconductor (or a portion where a current flows in a semiconductor when a transistor is on) and a gate overlap with each other, or a region where a channel is formed.

The channel width of a transistor is not necessarily constant in all regions. In other words, the channel width of a transistor is not limited to one value in some cases. Therefore, in this specification, the channel width is any one value, the maximum value, the minimum value, or the average value in a region in which a channel is formed.

Depending on the transistor structure, the channel width in a region in which a channel is actually formed (hereinafter referred to as an effective channel width) is different from the channel width shown in a top view of the transistor (hereinafter referred to as an apparent channel width) in some cases. For example, in a transistor with a three-dimensional structure, the effective channel width is larger than the apparent channel width shown in a top view of the transistor, and an influence of the effective channel width cannot be ignored in some cases. For example, in a miniaturized transistor with a three-dimensional structure, the proportion of a channel region formed on a side surface of a semiconductor is high in some cases. In this case, the effective channel width, that is, the width of an actually formed channel is larger than the apparent channel width shown in a top view.

In some cases, the effective channel width of a transistor with a three-dimensional structure is difficult to estimate on the basis of measurement. For example, estimation of the effective channel width from a design value requires an assumption that the shape of a semiconductor is known. Therefore, in the case where the shape of the semiconductor is uncertain, it is difficult to measure the effective channel width accurately.

Therefore, in this specification, in a top view of a transistor, an apparent channel width that is the length of a portion where a source and a drain face each other in a region in which a semiconductor and a gate electrode overlap with each other may be referred to as a surrounded channel width (SCW). In this specification, the simple term "channel width" may denote the surrounded channel width or the apparent channel width. Alternatively, in this specification, the simple term "channel width" may denote the effective channel width. Note that the values of the channel length, the channel width, the effective channel width, the apparent channel width, the surrounded channel width, and the like can be determined by obtaining and analyzing a cross-sectional TEM image or the like.

Note that the surrounded channel width may be used to calculate the field-effect mobility, the current value per channel width, and the like of a transistor. In this case, the values may be different from those calculated using the effective channel width.

In this specification and the like, the expression "A and B are connected" means the case where A and B are electrically connected to each other in addition to the case where A and B are directly connected to each other. Here, the expression "A and B are electrically connected" indicates that electric signals can be transmitted and received between A and B when an object having any electrical function exists between A and B.

Embodiment 1

In this embodiment, a semiconductor device of one embodiment of the present invention will be described.

FIG. 1A illustrates a semiconductor device 10 of one embodiment of the present invention. An input signal IN, an inverted input signal INB, and a standby signal STBE are input to the semiconductor device 10. The semiconductor device 10 outputs an output signal OUTH to a high voltage (MV) logic circuit 80. The input signal IN is a signal output from a low voltage (LV) logic circuit which operates at 1.2 V, for example. The input signal IN is a single-ended signal with a frequency of several hundred M to several GHz or more which is output from the LV logic circuit. The inverted input signal INB is an inverted signal of the input signal IN. The output signal OUTH is a signal boosted to operate the MV logic circuit 80 which operates at 3.3 V in synchronization with the input signal IN, for example.

The semiconductor device 10 includes a buffer circuit 20 (shown as "BUF1" in the diagram), a level shift circuit 40 (shown as "LS" in the diagram), and a buffer circuit 60 (shown as "BUF2" in the diagram).

Figure 1B:
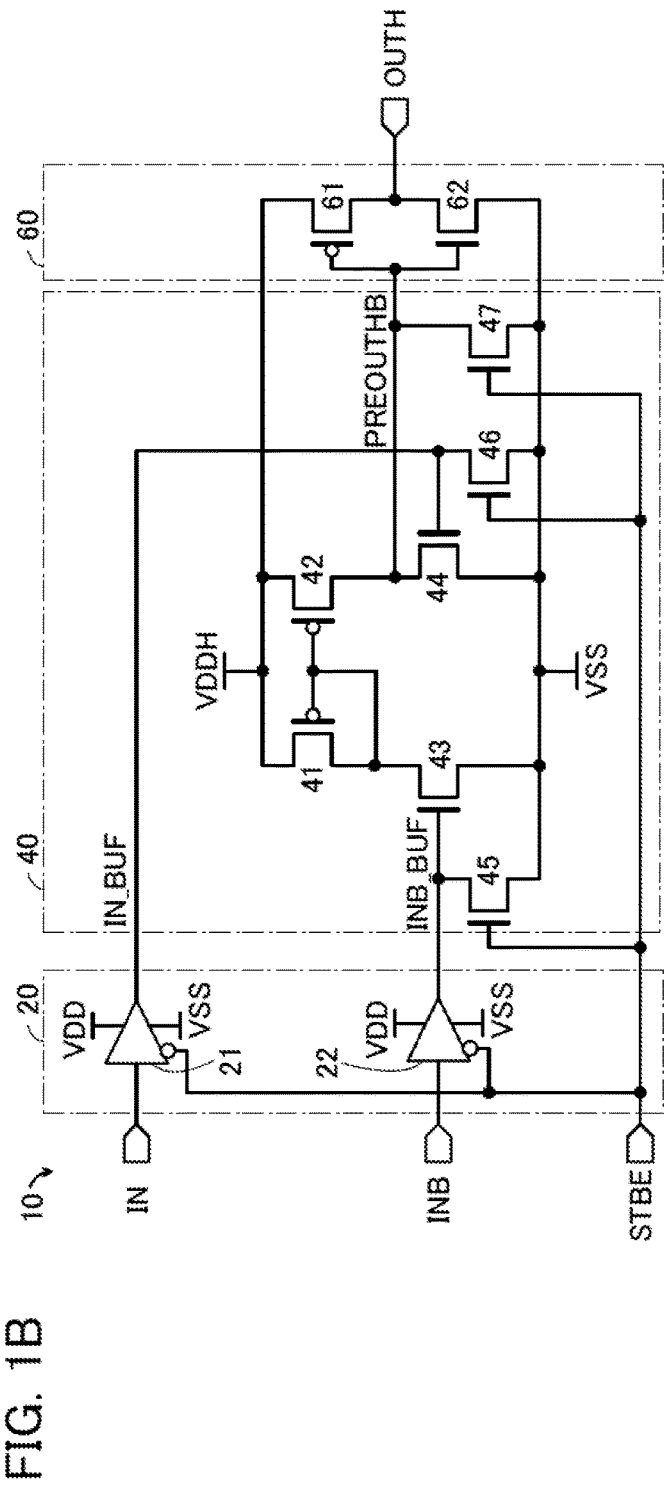

When the standby signal is an H level, the buffer circuit 20 becomes an active mode and functions as a buffer, whereas when the standby signal is an L level, the buffer circuit 20 becomes a standby mode or is in a resting state to make an output to be in a high impedance (Hi-Z) state. The buffer circuit 20 includes LV devices which can operate when a voltage of 1.2 V or less is applied. The LV device is a transistor, for example. The buffer circuit 20 is supplied with a voltage VDD (e.g., 1.2 V) and a voltage VSS (e.g., a ground voltage or 0 V). In FIG. 1B, the input signal IN which is output from the buffer circuit 20 is shown as an input signal IN_BUF. The inverted input signal INB which is output from the buffer circuit 20 is shown as an inverted input signal INB_BUF. Since the logics of the input signal IN and the input signal IN_BUF and the logics of the inverted input signal INB and the inverted input signal INB_BUF are the same, the input signal IN and the inverted input signal INB are used to describe the input signal IN_BUF and the inverted input signal INB_BUF, respectively, unless otherwise specified.

The level shift circuit 40 has a function of outputting the input signal IN and the inverted input signal INB with amplitudes of low voltages (1.2 V) output from the buffer circuit 20 as a signal boosted to a high voltage (3.3 V) to the buffer circuit 60. The level shift circuit 40 includes MV devices which can operate when a voltage of 3.3 V or less is applied. The MV device is a transistor, for example. Since a transistor which is the MV device includes a gate insulating film thicker than that of a transistor which is the LV device, the transistor which is the MV device excels in withstand voltage. A voltage VDDH (e.g., 3.3 V) and the voltage VSS are supplied to the level shift circuit 40. The voltage VDDH is higher than the voltage VDD.

The buffer circuit 60 functions as a buffer. The buffer circuit 60 is supplied with the voltage VDDH and the voltage VSS. The buffer circuit 60 includes MV devices which can operate when a voltage of 3.3 V or less is applied. The buffer circuit 60 outputs the output signal OUTH in response to an output voltage of the level shift circuit 40.

The MV logic circuit 80 is a logic circuit that operates at high speed of several GHz or more and is a transmitter (TX) that transmits data in LVDS, for example. TX converts the single-ended input signal which is boosted in the semiconductor device 10 into a differential current of ±3.5 mA and outputs the current.

FIG. 1B is a circuit diagram illustrating specific configuration examples of circuits included in the semiconductor device 10 illustrated in FIG. 1A.

The buffer circuit 20 includes a tri-state buffer 21 and a tri-state buffer 22. The tri-state buffer 21 and the tri-state buffer 22 include LV devices. When the standby signal STBE is an L level, the tri-state buffer 21 and the tri-state buffer 22 each becomes an active mode and functions as a buffer. When the standby signal STBE becomes an H level, the tri-state buffer 21 and the tri-state buffer 22 each becomes a standby mode to make an output to be in a high impedance (Hi-Z) state.

Since the standby signal STBE input to the buffer circuit 20 operates at the amplitude voltage of 1.2 V, which is less than the amplitude voltage (3.3 V) of the output signal, power consumption can be reduced. An active mode and a standby mode of the buffer circuit 20 can be switched with only a signal line to which the standby signal STBE is supplied. In the buffer circuit 20, since devices that are controlled by the standby signal STBE are LV devices, the active mode and the standby mode can be switched at high speed and the layout area can be reduced.

The level shift circuit 40 is a current-mirror level shift circuit and includes transistors 41 to 47. The transistors 41 and 42 are p-channel transistors (pMOS) and function as a current mirror circuit. The transistors 43 and 44 are n-channel (nMOS) transistors and function as a differential amplifier circuit. The transistors 45, 46 and 47 are nMOS transistors and function as switches.

The transistors 41 to 44 are MV devices. In the current mirror circuit including the transistors 41 and 42, when the transistor 43 is turned on and the transistor 44 is turned off, a current flowing through the transistor 43 flows through the transistor 41, and the current flowing through the transistor 41 is copied by the transistor 42, whereby a voltage of a node PREOUTHB is increased. In the current mirror circuit, when the transistor 43 is turned off and the transistor 44 is turned on, a current flows through the transistor 44 and a voltage of the node PREOUTHB is decreased. That is, the differential amplifier circuit including the transistors 43 and 44 has a function of pulling down gates of the transistors 43 and 44 using the input signal IN and the inverted input signal INB as differential signals.

A switch circuit including the transistors 45 to 47 is brought into a conduction state when the standby signal STBE is an H level and is brought into a non-conducting state when the standby signal STBE is an L level. That is, when the standby signal STBE is set to an H level, both of the transistors 43 and 44 are turned off, so that the voltage of the node PREOUTHB can be the voltage VSS. Thus, the switch circuit including the transistors 45 to 47 has a function of making a current flowing through the differential amplifier circuit into a resting state in response to the standby signal STBE.

The buffer circuit 60 includes a transistor 61 and a transistor 62. The buffer circuit 60 includes MV devices. The buffer circuit 60 functions as a buffer which outputs a signal for controlling the MV logic circuit 80 in the subsequent stage.

The semiconductor device 10 including the current-mirror level shift circuit 40 illustrated in FIG. 1B can operate at very high speed because the balance between a current flowing to the pMOS transistor and a current flowing to the nMOS transistor does not need to be considered unlike in the cross-coupled level shift circuit. Since the balance between the current flowing to the pMOS transistor and the current flowing to the nMOS transistor does not need to be considered, high linearity of rising of the output voltage OUTH (a change from an L level to an H level) and that of falling of the output voltage OUTH (a change from an H level to an L level) can be achieved.

Furthermore, since the channel width (W) of each of the pMOS transistor and the nMOS transistor can be made small, the layout area can be reduced. This is because the pMOS transistors (the transistors 41 and 42) in the current-mirror level shift circuit operate so as to copy a current of the nMOS transistor (the transistor 43), and thus the ratio of drive capability between the pMOS transistor and the nMOS transistor does not need to be taken into consideration. In contrast, since the cross-coupled level shift circuit does not operate stably unless the drive capability of the nMOS transistor is sufficiently improved as compared to that of the pMOS transistor, the channel width of the nMOS transistor needs to be made sufficiently larger than the channel width of the pMOS transistor, which increases the layout area.

The semiconductor device 10 illustrated in FIG. 1B includes the current-mirror level shift circuit 40, which increases consumption current in some cases. This is because a static constant current flows through the transistor 41 and the transistor 43 when the inverted input signal INB is an H level. However, the semiconductor device 10 in FIG. 1B is LVDS-TX which supplies the output signal OUTH and by which the MV logic circuit 80 operates at high speed, and high-speed operation is proportional to consumption current. In addition, while TX consumes power of at least 3.5 mA according to the standard, the static constant current of the current-mirror level shift circuit is several 100 μA; thus, consumption current in the operation does not become a significant problem.

In the case where driving for stopping transmission of a signal intermittently is performed in LVDS-TX, static constant current becomes a problem. Thus, the semiconductor device 10 including the current-mirror level shift circuit 40 illustrated in FIG. 1B has a structure in which the mode can be switched to a standby mode so that static constant current can be reduced. Specifically, when the standby signal STBE is an H level, each of the outputs of the tri-state buffers 21 and 22 is Hi-Z, and each of the gates of the transistors 43 and 44 and the node PREOUTHB is pulled down to an L level by the transistors 45 to 47 included in the switch circuit.

In the semiconductor device 10 including the current-mirror level shift circuit 40 illustrated in FIG. 1B, the mode can be switched to a standby mode with only nMOS transistors, without using both nMOS transistors and pMOS transistors for pulling down MV devices. Although the standby signal STBE has small amplitude because the signal is also supplied to the tri-state buffers 21 and 22 including LV devices, when all of the transistors for pulling down are nMOS transistors, the standby signal STBE is partly shared because even the signal with small amplitude can function well.

Specific configuration examples of transistors supplied with the standby signal STBE are described with reference to FIGS. 2A and 2B and FIG. 3, FIG. 4, and FIG. 5. In FIGS. 2A and 2B and FIG. 3, FIG. 4, and FIG. 5, MV devices are shown as "MV". LV devices are shown as "LV". A standby signal with an amplitude voltage of a voltage VDD-VSS is shown as "STBE_LV". A standby signal having an amplitude voltage of a voltage VDDH-VSS is shown as "STBE_MV".

Figure 2A:
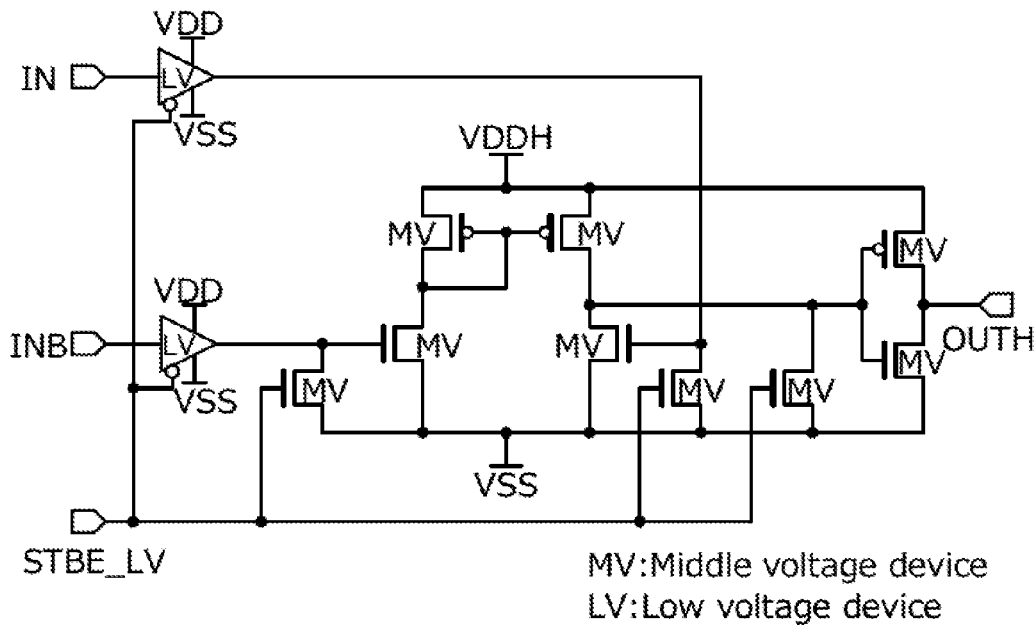
FIGS. 2A and 2B are circuit diagrams illustrating one embodiment of the present invention.

In FIG. 2A, the transistors 45 to 47 illustrated in FIG. 1B are shown as MV devices and the standby signal is shown as STBE_LV. Even when the standby signal STBE_LV with a small amplitude voltage is used as the standby signal STBE, the transistors 45 to 47 can pull down nodes to which the transistors are connected. When the standby signal STBE_LV with a small amplitude voltage is used, power consumption can be reduced.

Figure 2B:
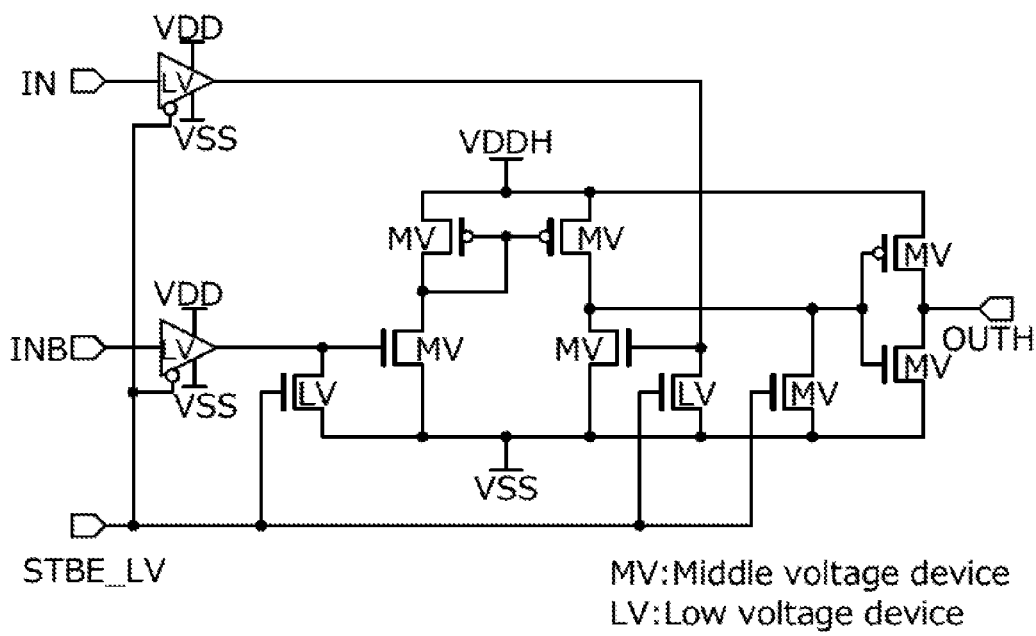

In FIG. 2B, the transistor 47 shown in FIG. 1B is shown as an MV device, the transistors 45 and 46 shown in FIG. 1B are shown as LV devices, and the standby signal is shown as STBE_LV. Even when the standby signal STBE_LV with a small amplitude voltage is used as the standby signal STBE, the transistors 45 to 47 can pull down nodes to which the transistors are connected. Even when the transistors 45 and 46 illustrated in FIG. 1B are LV devices, a high voltage is not applied to each of the transistors 45 and 46; thus, the transistors 45 and 46 can function well. Therefore, power consumption and the layout area can be reduced using the standby signal STBE_LV with a small amplitude voltage.

Figure 3:
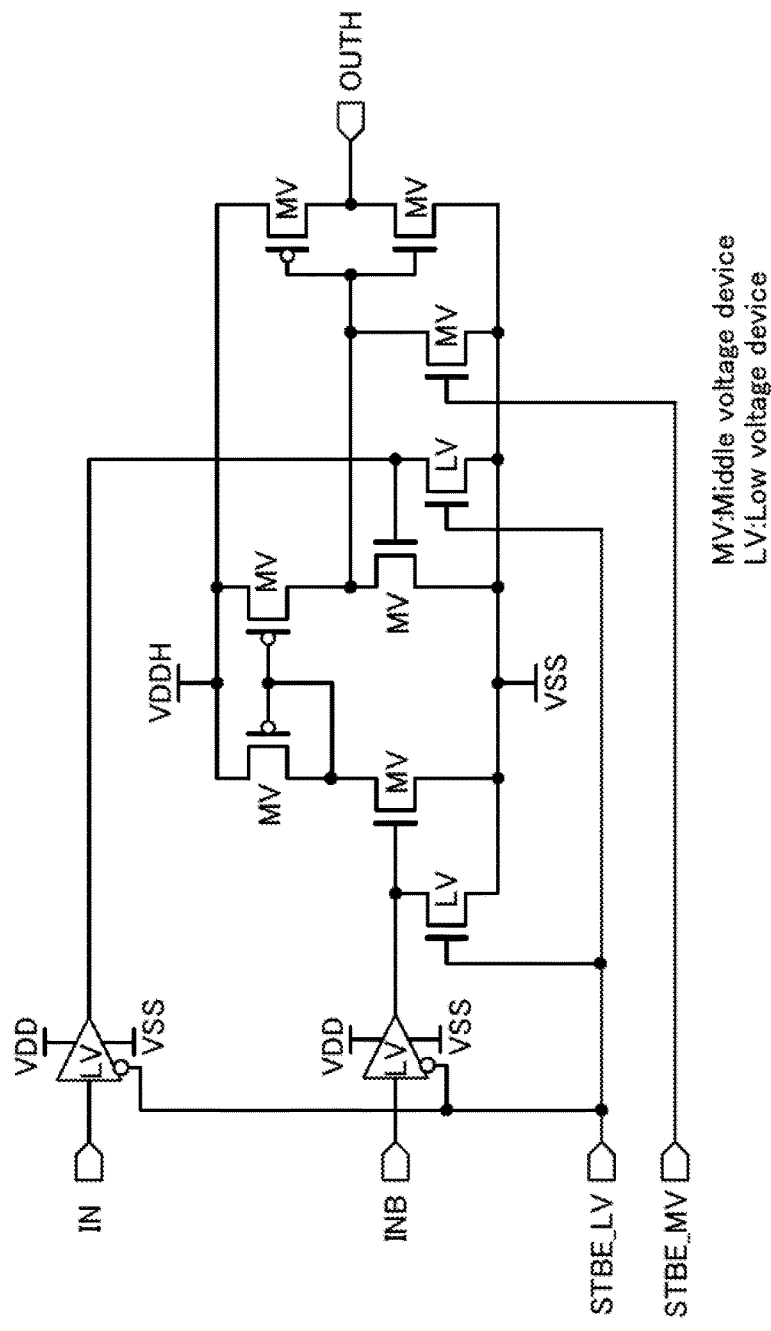
FIG. 3 is a circuit diagram illustrating one embodiment of the present invention.
Figure 4:
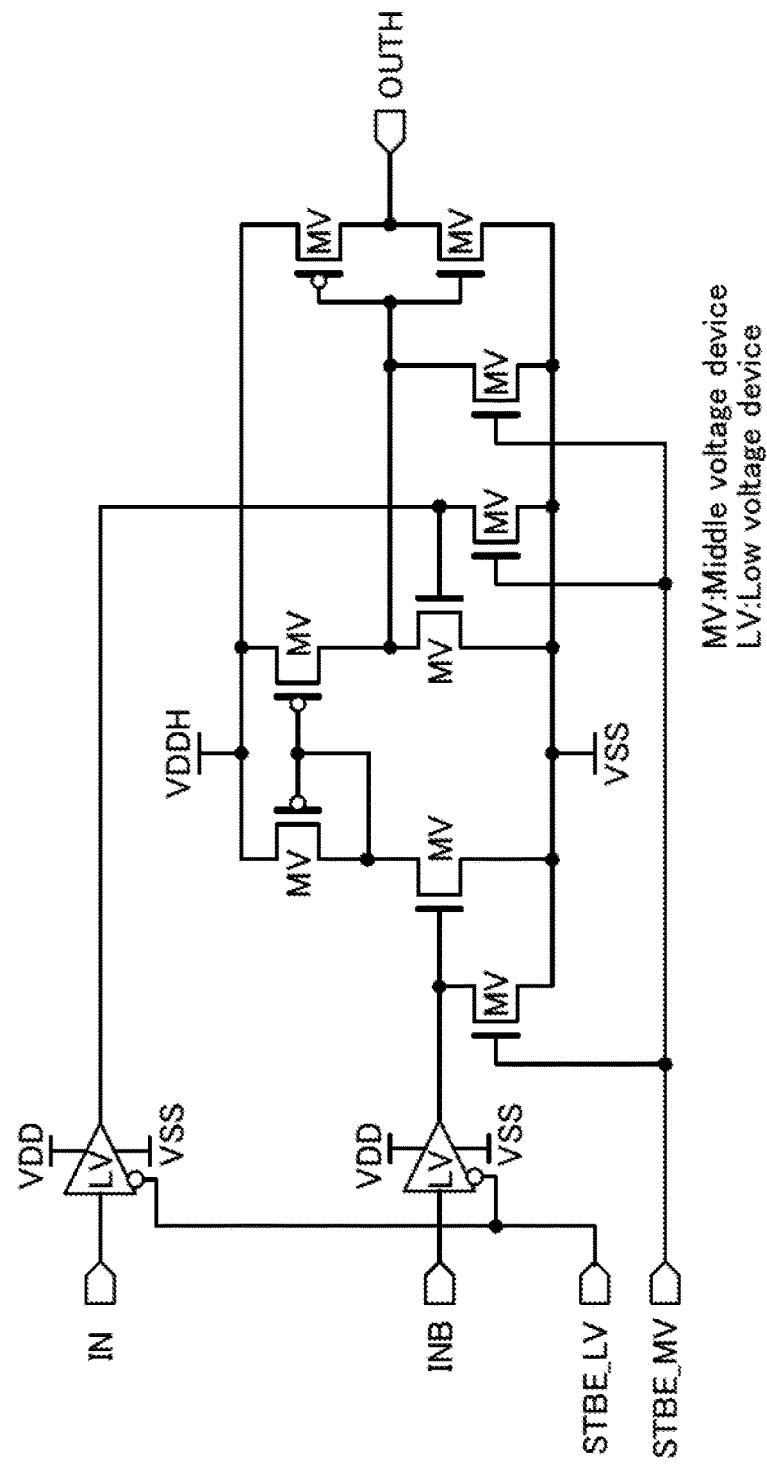
FIG. 4 is a circuit diagram illustrating one embodiment of the present invention.
Figure 5:
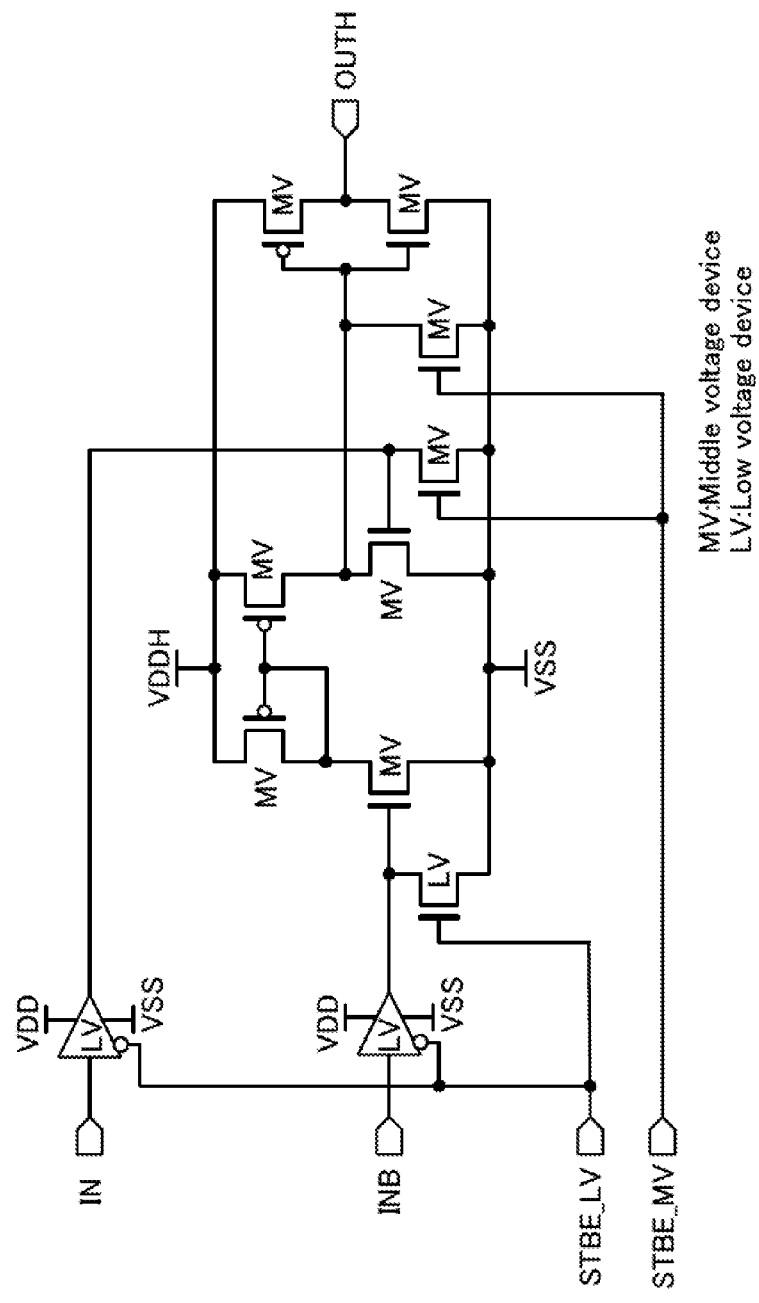
FIG. 5 is a circuit diagram illustrating one embodiment of the present invention.

In FIG. 3, the transistor 47 shown in FIG. 1B is shown as an MV device, the transistors 45 and 46 shown in FIG. 1B are shown as LV devices, and the standby signals are shown as two signals of the standby signal STBE_MV and the standby signal STBE_LV. In. FIG. 4, the transistors 45 to 47 shown in FIG. 1B are shown as MV devices, and the standby signals are shown as two signals of the standby signal STBE_MV and the standby signal STBE_LV. In FIG. 5, the transistor 45 shown in FIG. 1B is shown as an LV device, the transistors 46 and 47 shown in FIG. 1B are shown as MV devices, and the standby signals are shown as two signals of the standby signal STBE_MV and the standby signal STBE_LV. Power consumption and the layout area can be reduced using the standby signal STBE_LV with a small amplitude voltage as the standby signal for controlling the MV devices and the LV devices as shown in FIGS. 3 to 5. When the standby signal STBE_MV with a large amplitude voltage is used, high-speed switching operation can be achieved.

Figure 6:
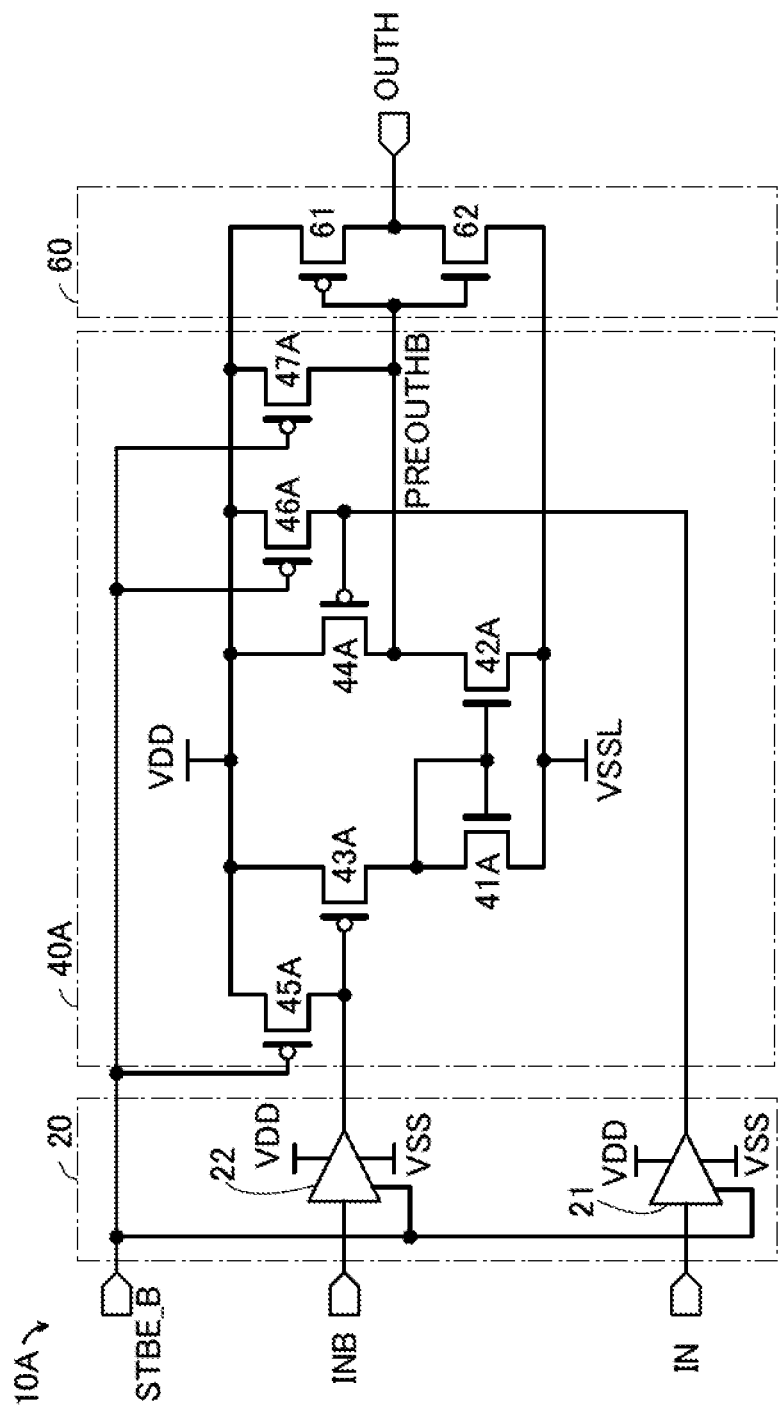
FIG. 6 is a circuit diagram illustrating one embodiment of the present invention.

As another configuration example, in FIG. 6, a semiconductor device 10A controlled by the inverted standby signal STBE_B is shown in which polarities of the transistors are different from those in the semiconductor device 10 in FIG. 1B, a voltage which is a voltage lower than the voltage LSS is supplied, and the voltage level to be output is shifted. FIG. 6 shows a circuit diagram in which the level shift circuit 40 in FIG. 1B is the level shift circuit 40A. The level shift circuit 40A shown in FIG. 6 includes transistors 41A, 42A, 43A, 44A, 45A, 46A, and 47A as transistors which have different polarities. The transistors 41A and 42A are nMOS transistors and the transistors 43A, 44A, 45A, 46A, and 47A are pMOS transistors.

FIG. 7A shows each of the tri-state buffers 21 and 22 shown in FIG. 1B, and FIG. 7B shows an example of a specific circuit diagram of each of the tri-state buffers 21 and 22. FIGS. 7A and 7B show a control signal ENB corresponding to the standby signal STBE. FIG. 7C shows a truth table of each of the tri-state buffers 21 and 22 in FIGS. 7A and 7B.

In FIG. 7B, each of the tri-state buffers 21 and 22 include transistors 23 to 32. The transistors 23 to 27 are pMOS transistors and the transistors 28 to 32 are nMOS transistors. Note that the circuit is not limited to that in FIG. 7B and may be any circuit as long as the circuit satisfies the truth table in FIG. 7C.

Figure 8:
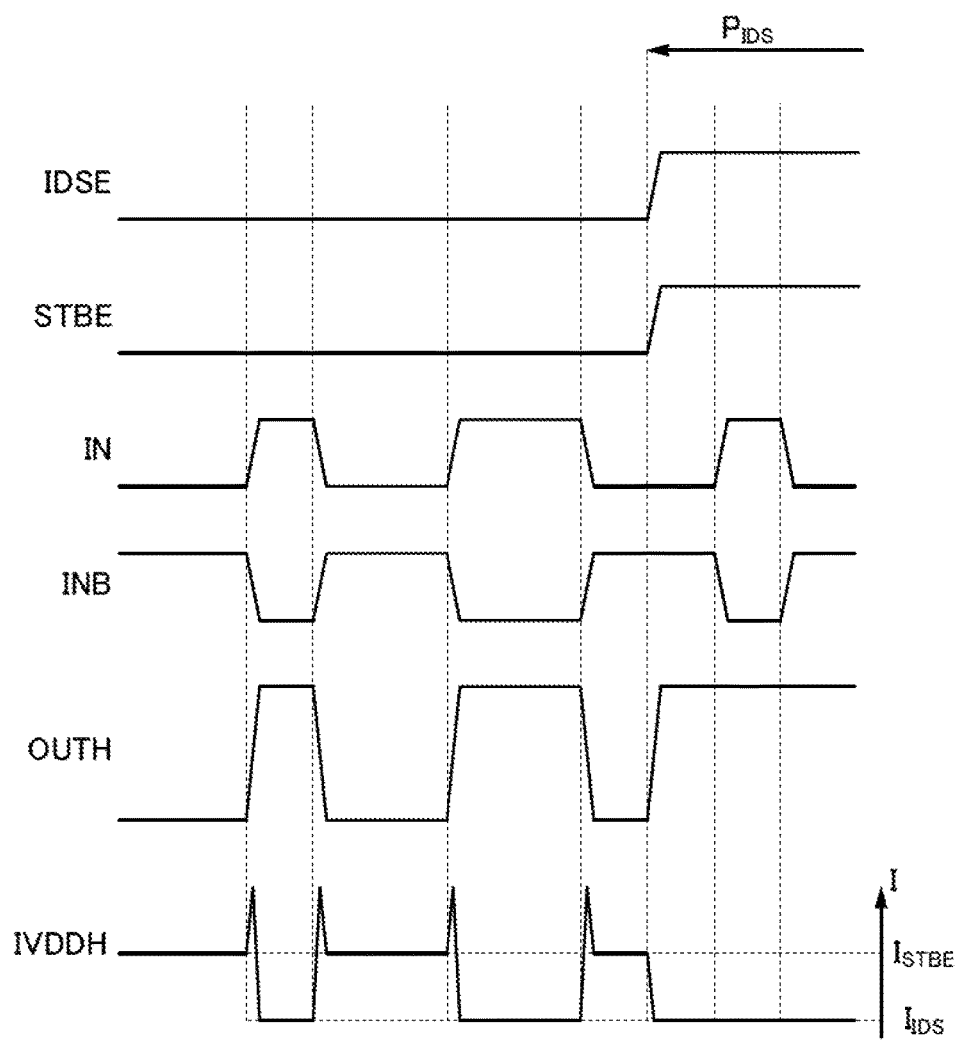
FIG. 8 is a timing chart showing one embodiment of the present invention.

FIG. 8 shows a timing chart for illustrating operations in the active mode and the standby mode of the current-mirror level shift circuit shown in FIG. 1B. In the following description, in a period of driving in which transmission of a signal is stopped intermittently in LVDS-TX, a signal IDSE (idling stop enable) is set to an H level and the mode is referred to as an idling stop mode ($P_{IDS}$).

When the signal IDSE is an H level, the mode becomes the idling stop mode. The idling stop mode is in synchronization with the standby mode of the level shift circuit. Thus, the signal IDSE is in synchronization with the standby signal STBE.

A current IVDDH in FIG. 8 shows a consumption current which flows from a wiring that supplies the voltage VDDH shown in FIGS. 1A and 1B to the level shift circuit 40. As described above, although several hundreds of μA ($I_{STBE}$) of a static constant current flows in a period in which the inverted input signal INB is an H level, the current can be reduced to several nA to several 10 nA ($I_{IDS}$) in a period in which the signal IDSE and the standby signal STBE are each an H level.

Figure 9A:
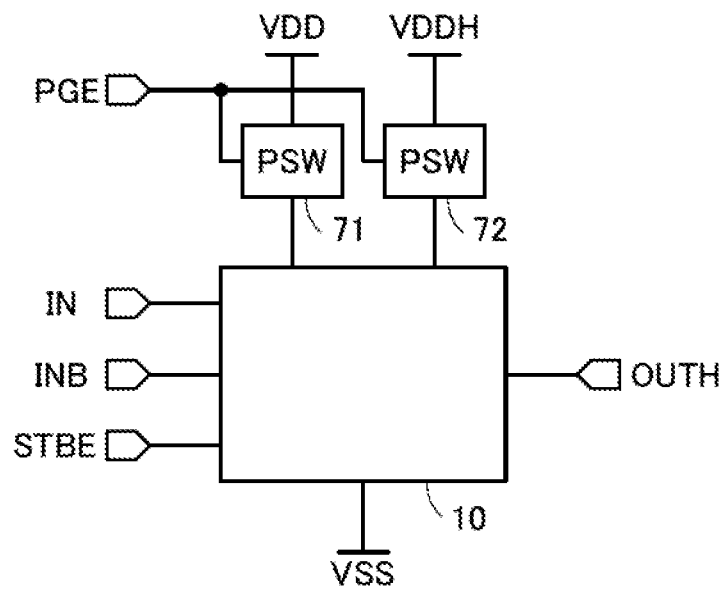
FIGS. 9A to 9E are circuit diagrams for illustrating one embodiment of the present invention.

FIG. 9A shows a structure where a power gating function is provided to further reduce power consumption of the semiconductor device 10 illustrated in FIG. 1B. The voltage VDD and the voltage VDDH which supply power supply voltages to the circuits of the semiconductor device 10 are input to the level shift circuit 40 via power switches 71 and 72 (PSW in the drawing). Each of the power switches 71 and 72 can be controlled by a power gating signal PGE. When the power gating signal PGE is made active, i.e., the power gating signal PGE is set at an H level, power consumption of the semiconductor device 10 can be further reduced. A mode in which power is gated by the power gating signal PGE is referred to as a power gating mode.

Figure 9B:
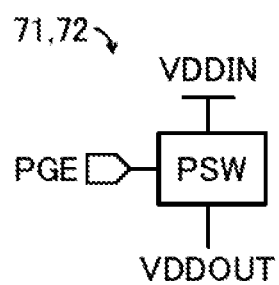
Figure 9C:
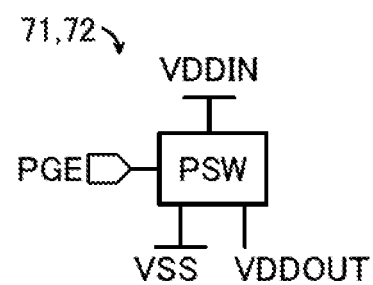
Figure 9D:
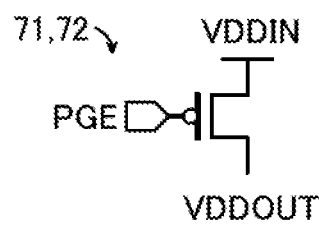
Figure 9E:
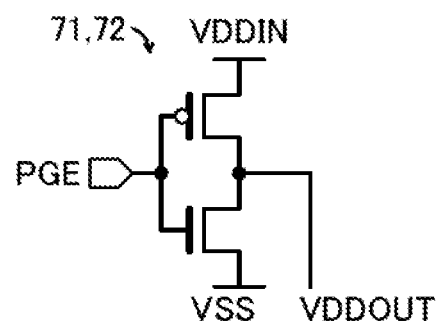

When a voltage which is supplied by each of the power switches 71 and 72 is shown as VDDIN and a voltage which is output from each of the power switches 71 and 72 is shown as VDDOUT, the structure shown in FIG. 9B in which the voltage VDDOUT is brought into an electrically floating state may be employed. Alternatively, the structure shown in FIG. 9C in which the voltage VDDOUT is switched to the voltage VDDIN or the voltage VSS may be employed. As a specific circuit configuration to obtain the structure in FIG. 9B, the circuit configuration in FIG. 9D may be employed. As a specific circuit configuration to obtain the structure in FIG. 9C, the circuit configuration in FIG. 9E may be employed.

Figure 10:
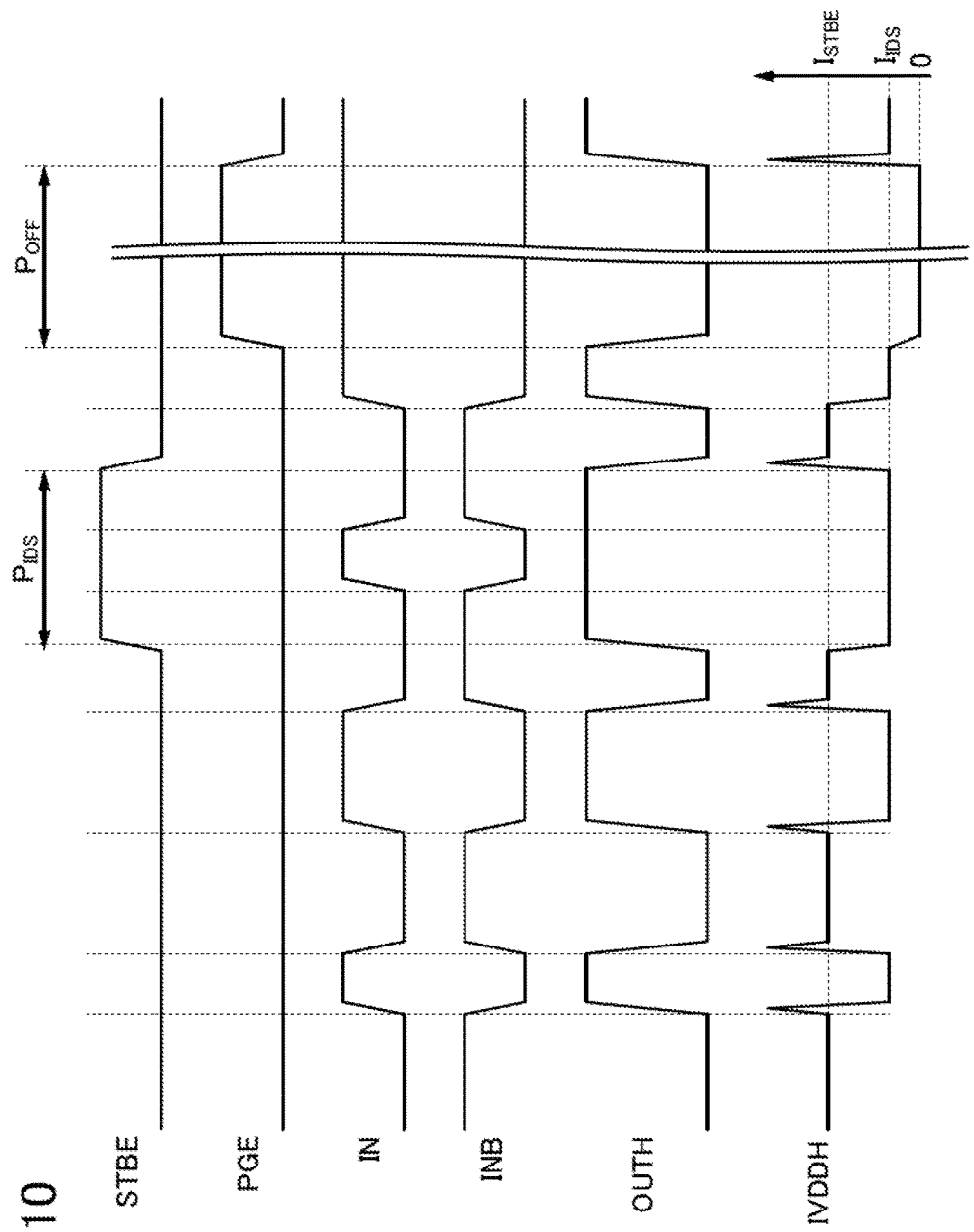
FIG. 10 is a timing chart for illustrating one embodiment of the present invention.

FIG. 10 shows a timing chart at the time of the standby mode ($P_{IDS}$) and the power gating mode ($P_{OFF}$) of the current-mirror level shift circuit shown in FIG. 1B. In the standby mode, a consumption current of several nA to several 10 nA flows because a leakage current ($I_{IDS}$) between a source and a drain is generated in each of the transistors, whereas in the power gating mode, consumption current does not flow at all because a wiring which supplies the voltage VDD and a wiring which supplies the voltage VDDH are electrically insulated from each of the circuits. Whether the mode is shifted to the standby mode or the power gating mode can be determined depending on the state of the peripheral circuit so that the optimal mode can be selected.

Figure 11A:
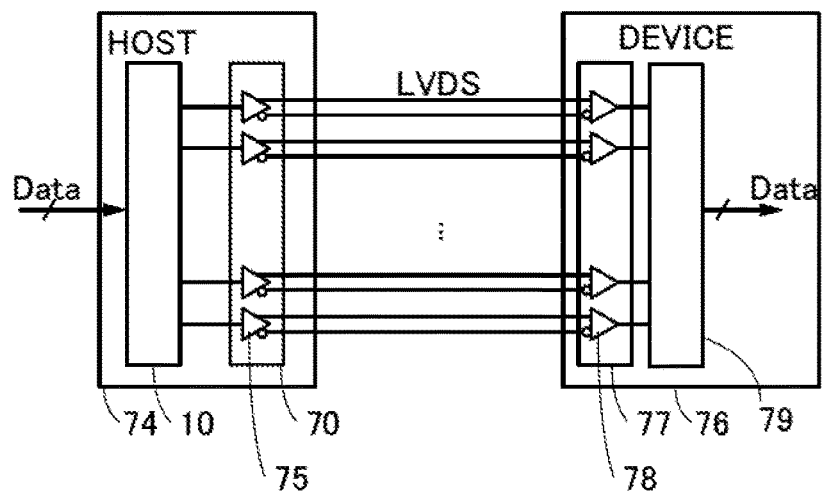
FIGS. 11A to 11C are circuit diagrams for illustrating one embodiment of the present invention.
Figure 11B:
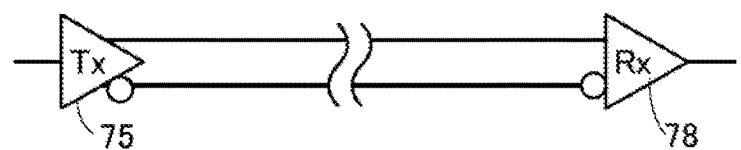
Figure 11C:
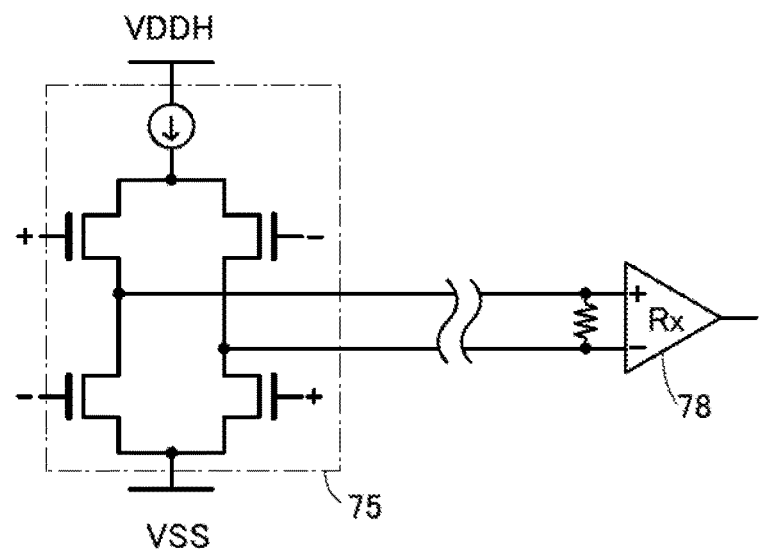

FIGS. 11A to 11C show examples of an interface circuit to which a semiconductor device functioning as the above described level shift circuit can be applied.

FIG. 11A illustrates a signal transmitting circuit 74 (HOST in the drawing) including the semiconductor device 10 shown in FIG. 1A and a high voltage logic circuit 70 which is LVDS-TX, and a signal transmitting circuit 76 (DEVICE in the drawing) including a high voltage logic circuit 77 which is LVDS-RX and a signal processing circuit 79.

The high voltage logic circuit 70 includes a plurality of transmitter circuits 75. The high voltage logic circuit 77 includes a plurality of receiver circuits 78. FIG. 11B shows a pair of the transmitter circuit 75 and the receiver circuit 78. Two wirings between the transmitter circuit 75 and the receiver circuit 78 each has a function of transferring a differential signal.

FIG. 11C shows an example of the transmitter circuit 75 shown in FIG. 11B. The transmitter circuit 75 can transmit a differential signal by controlling conduction states of each of transistors alternately (alternately turning on a plus terminal and a minus terminal in the drawing), for example. The transmitter circuit 75 can convert a single-ended input signal into a differential current of ±3.5 mA and output the current.

Figure 12A:
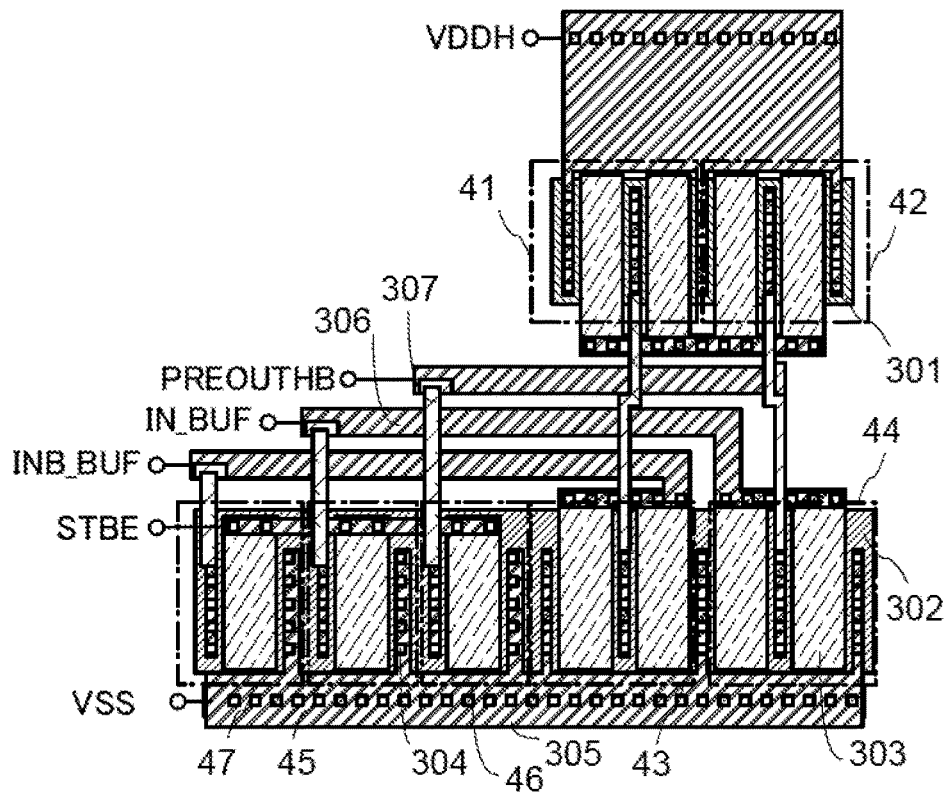
FIGS. 12A and 12B are a layout diagram and a cross-sectional view for illustrating one embodiment of the present invention.

FIG. 12A illustrates an example of an actually designed layout diagram of the level shift circuit 40 shown in FIG. 1B. FIG. 12A illustrates part of conductive layers, impurity regions, and an opening included in the level shift circuit 40 for easy understanding, and an insulating layer and the like are not illustrated.

FIG. 12A illustrates the transistor 41, the transistor 42, the transistor 43, the transistors 44, 45, 46, and 47 which are illustrated in FIG. 1B. FIG. 12A shows an n-type impurity region 301, a p-type impurity region 302, and conductive layers 303, 304, 305, 306, and 307.

In FIG. 12A, the n-type impurity region 301 serves as a source region or a drain region in an n-channel (nMOS) transistor. The p-type impurity region 302 serves as a source region or a drain region in a p-channel (pMOS) transistor.

The conductive layer 303 serves as a gate electrode in each of the nMOS transistor and the pMOS transistor. The conductive layer 304 serves as a source electrode or a drain electrode. The conductive layer 305 serves as a wiring for electrically connecting elements. The conductive layer 307 serves as a wiring for electrically connecting elements, and the conductive layer 306 serves as an electrode for electrically connecting the conductive layer 307 and the conductive layer 305. In FIG. 12A, the input signal IN_BUF, the inverted input signal INB_BUF, the node PREOUTHB, and the standby signal STBE shown in FIG. 1B are supplied to conductive layers, and voltages VDDH and VSS are similarly shown.

As illustrated in FIG. 12A, the channel width (W) of each of the pMOS transistor and the nMOS transistor can be decreased in the structure of one embodiment of the present invention because the balance between the current flowing to the pMOS transistor and the current flowing to the nMOS transistor does not need to be considered unlike in a cross-coupled level shift circuit. Therefore, the channel width of the nMOS transistor is not necessarily made larger than that of the pMOS transistor in order to sufficiently increase the drive capability of the nMOS transistor as compared to that of the pMOS transistor; thus, the layout area can be reduced. The transistors 45 to 47 serving as switches can each function well with a smaller channel width than the transistors 41 and 42 included in the current-mirror circuit or the transistors 43 and 44 included in the differential amplifier circuit.

Figure 12B:
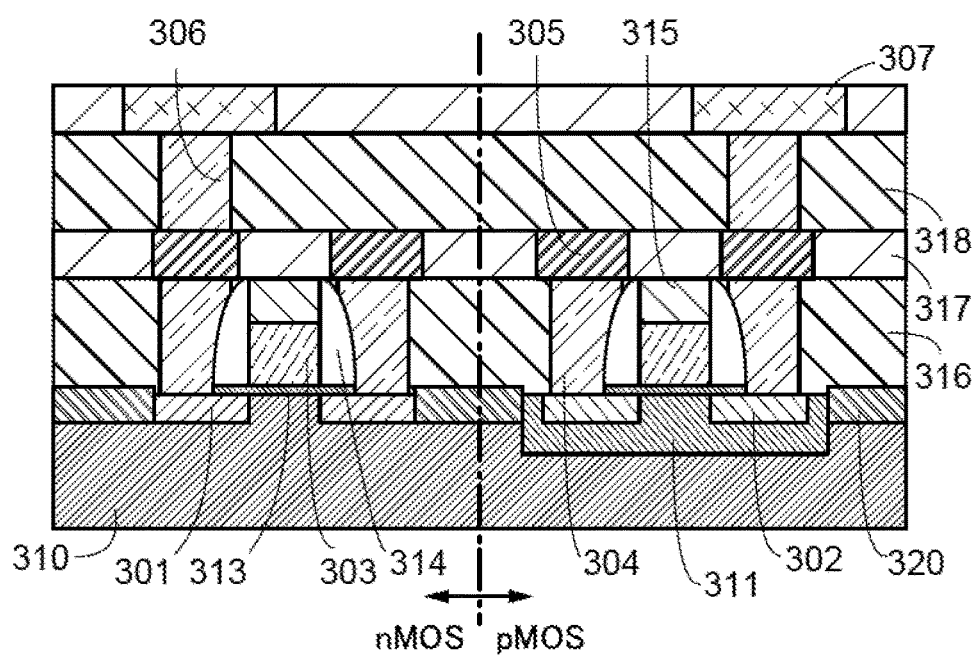

FIG. 12B illustrates an example of a cross-sectional structure of a transistor which can be applied to the layout view in FIG. 12A. In FIG. 12B, an n-channel transistor is shown as nMOS, and a p-channel transistor is shown as pMOS.

FIG. 12B illustrates a p-type semiconductor substrate 310, the n-type impurity region 301, an n-type impurity region 311, the p-type impurity region 302, an element isolation layer 320, a gate insulating layer 313, a side wall 314, and interlayer insulating layers 315, 316, 317, and 318. Note that an interlayer insulating layer and a conductive layer may be provided over the conductive layer 307.

When the transistors are formed using a single crystal semiconductor substrate, the transistors can operate at high speed. Accordingly, a single crystal semiconductor substrate is preferably used for transistors that form each circuit in the above embodiment. Note that the semiconductor substrate can be, for example, a compound semiconductor substrate containing silicon carbide or gallium nitride, a silicon on insulator (SOI) substrate, or a glass substrate.

A metal material such as aluminum, copper, titanium, tantalum, or tungsten is preferably used for each of the conductive layers 303, 304, 305, 306, and 307. Alternatively, polycrystalline silicon to which an impurity such as phosphorus is added can be used. As the formation method, a variety of film formation methods such as an evaporation method, a PE-CVD method, a sputtering method, and a spin coating method can be used.

Each of the element isolation layer 320, the gate insulating layer 313, the side wall 314, and the interlayer insulating layers 315, 316, 317, and 318 is preferably a single layer or a multilayer including an inorganic insulating layer or an organic insulating layer. The inorganic insulating layer is preferably a single layer or a multilayer formed using a silicon nitride film, a silicon oxynitride film, a silicon nitride oxide film, or the like. The organic insulating layer is preferably a single layer or a multilayer formed using a polyimide, acrylic, or the like. There is no particular limitation on a method for forming each of the insulating layers; for example, a sputtering method, an MBE method, a PE-CVD method, a pulse laser deposition method, or an ALD method can be employed as appropriate.

The operation speed of the above-described semiconductor device of one embodiment of the present invention can be increased. In addition, power consumption of the semiconductor device of one embodiment of the present invention can be reduced. Furthermore, the layout area of the semiconductor device of one embodiment of the present invention can be reduced.

At least part of this embodiment can be implemented in combination with any of the other embodiments and the other examples described in this specification as appropriate.

Embodiment 2

This embodiment will explain a display device that can include the semiconductor device shown in Embodiment 1.
<Display Device 100>

Figure 13:
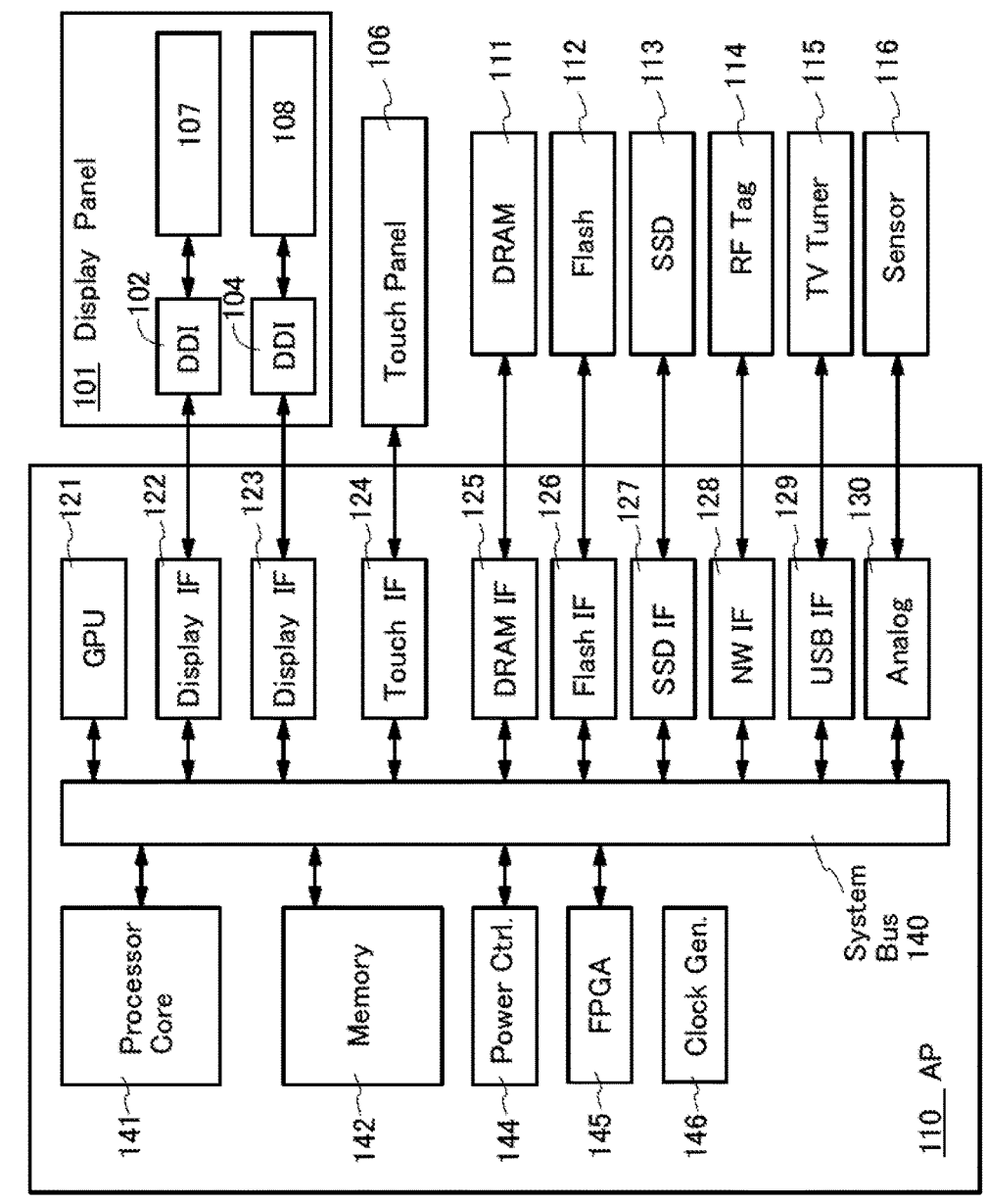
FIG. 13 is a block diagram showing a configuration example of a display device.

FIG. 13 is a block diagram illustrating a configuration example of a display device 100. The display device 100 includes an application processor (hereinafter "AP") 110, a display panel 101, a touch panel 106, a dynamic random access memory (DRAM) 111, a flash memory 112, a solid state drive (SSD) 113, an RF tag 114, a TV tuner 115, and a sensor 116.

The AP 110 includes a graphics processing unit (GPU) 121, a display_IF (IF: interface) 122, a display_IF 123, a touch panel_IF 124, a DRAM_IF 125, a flash memory_IF 126, an SSD_IF 127, a network_IF 128, a universal serial bus (USB)_IF 129, an analog circuit 130, a system bus 140, a processor core 141, a memory 142, a power control circuit 144, a field programmable gate array (FPGA) 145, and a clock generator circuit 146.

The AP 110 is connected to the display panel 101 through the display_IF 122 and the display_IF 123, connected to the touch panel 106 through the touch panel_IF 124, connected to the DRAM 111 through the DRAM_IF 125, connected to the flash memory 112 through the flash memory_IF 126, connected to the SSD 113 through the SSD_IF 127, connected to the RF tag 114 through the network_IF 128, connected to the TV tuner 115 through the USB_IF 129, and connected to the sensor 116 through the analog circuit 130.

The processor core 141 has a function of controlling the overall AP 110. The processor core 141 transmits instructions and data to each circuit through the system bus 140. For example, the processor core 141 runs basic software (an operating system: OS) and various kinds of application software using the memory 142, the DRAM 111, and the SSD 113 as a cache memory, a main memory device, and an external memory device, respectively. Note that the processor core 141 can have a single-core, dual-core, multi-core, or many-core architecture or have a cache memory hierarchy such as Level 1 (L1) and Level 2 (L2), as determined by the computational performance required for a system.

The AP 110 has a function of supplying a video signal stored in an external memory device such as the DRAM 111, the flash memory 112, or the SSD 113 to the display panel 101. The AP 110 can also supply a video signal received by the TV tuner 115 to the display panel 101.

The GPU 121 is a processor specialized for image processing. The GPU 121 can perform advanced image processing such as three-dimensional image processing. Image data generated in the GPU 121 is transmitted to the display panel 101 through the display_IFs 122 and 123, and an image based on the image data is displayed on the display panel 101.

A user of the display device 100 can input information from the touch panel 106. The AP 110 senses a touch signal input by the user and updates an image on the display panel 101.

The touch panel 106 can be a resistive touch panel or a capacitive touch panel and can be used by overlapping the display panel 101. The touch panel 106 which is an optical touch panel can be incorporated in the display panel 101.

The display panel 101 includes a display driver IC (DDI) 102, a reflective element 107, a DDI 104, and a light-emitting element 108.

The DDI 102 has a function of driving the reflective element 107. The DDI 102 is connected to the AP 110 through the display_IF 122.

The DDI 104 has a function of driving the light-emitting element 108. The DDI 104 is connected to the AP 110 through the display_IF 123.

The display_IFs 122 and 123 have a function of converting one video signal into another video signal with a format compatible with the display panel 101. The display_IFs 122 and 123 each include a correction circuit (for gamma correction, chromaticity correction, luminance correction, or the like), a decoder, and a frame memory, for example.

The reflective element 107 is a display element that displays an image by utilizing reflection of external light and can be, for example, a liquid crystal element, a shutter-type microelectromechanical systems (MEMS) element, an optical-interference-type MEMS element, an element employing a microcapsule method, an electrophoretic element, an electrowetting element, or electronic liquid powder (registered trademark). The use of a reflective display element in the display panel 101 leads to a reduction in power consumption of the display panel 101. In the following description, a reflective liquid crystal element is used as the reflective element 107.

As the light-emitting element 108, it is possible to use a self-luminous light-emitting element such as an organic electroluminescent (EL) element, an inorganic EL element, a light-emitting diode (LED), a quantum-dot light-emitting diode (QLED), or a semiconductor laser. In the following description, an organic EL element is used as the light-emitting element 108.

As the sensor 116, a variety of sensors can be used as needed. The sensor 116 can be a device capable of sensing force, position, speed, acceleration, angular velocity, rotational frequency, distance, light, magnetism, temperature, chemical substance, sound, hardness, current, voltage, electric power, radiation, flow rate, humidity, gradient, or oscillation, for example. Information (analog data) obtained by the sensor 116 is converted into digital data by the analog circuit 130.

When the sensor 116 is an optical sensor, for example, the display device 100 can change a display mode of the display panel 101 in response to light received by the sensor 116.

When sufficient luminance is obtained only with the reflective element 107, e.g., when the display device 100 is used outside on a sunny day, it is not necessary to make the light-emitting element 108 emit light. This is because favorable display is not obtained by using the light-emitting element 108 owing to strong external light. In contrast, when the display device 100 is used at night or in a dark place, display is performed by making the light-emitting element 108 emit light.

In response to the brightness of external light, the AP 110 can generate image data with which display is performed only by the reflective element 107, image data with which display is performed only by the light-emitting element 108, or image data with which display is performed by a combination of the reflective element 107 and the light-emitting element 108. Consequently, the display panel 101 can perform favorable display both in an environment with bright external light and in an environment with weak external light. Moreover, power consumption can be reduced by making the light-emitting element 108 emit no light or reducing the luminance of the light-emitting element 108 in an environment with bright external light.

The AP 110 can correct color tones of the display panel 101 by combining the display by the light-emitting element 108 with the display by the reflective element 107. For example, when the display device 100 is used in a reddish environment at nightfall, a blue (B) component is not sufficient only with the display by the reflective element 107; thus, the color tones can be corrected by making the light-emitting element 108 emit light.

The memory 142 is any rewritable memory such as dynamic oxide semiconductor RAM (DOSRAM, registered trademark), nonvolatile oxide semiconductor RAM (NOSRAM, registered trademark), SRAM, flash memory, ferroelectric RAM (FeRAM), magnetoresistive RAM (MRAM), resistive RAM (ReRAM), or phase-change RAM (PRAM). In particular, DOSRAM or NOSRAM is preferably used. The use of DOSRAM or NOSRAM as the memory 142 can reduce power consumption of the AP 110. Note that DOSRAM and NOSRAM will be described later.

The power control circuit 144 has a function of controlling power supply in the display device 100.

Because of including the FPGA 145, the AP 110 can flexibly deal with a case where a new function needs to be added after chip shipment. There is no need to design a chip newly; hence, the cost can be drastically reduced.

The clock generator circuit 146 has a function of generating a clock signal used in the display device 100. The clock generator circuit 146 can change the frequency of the clock signal and thus can achieve high performance and low power consumption of the display device 100. The clock generator circuit 146 increases the clock frequency when faster processing is needed. Meanwhile, the clock generator circuit 146 can decrease the clock frequency in order to reduce power consumption of the display device 100.

The semiconductor device described in Embodiment 1 is preferably used in the display_IFs 122 and 123, for example. For example, in the case where a video signal is supplied to the display panel 101 by LVDS, power consumption can be reduced and switching in boosting a voltage to a desired voltage can be performed at high speed.

<DOSRAM>

Next, a DOSRAM will be described in detail with reference to FIGS. 14A and 14B.

FIG. 14A illustrates a configuration example of a DOSRAM 500. The DOSRAM 500 includes a control portion 502, a cell array 503, and a peripheral circuit 508. The peripheral circuit 508 includes a sense amplifier circuit 504, a driver 505, a main amplifier 506, and an input/output circuit 507.

The control portion 502 has a function of controlling the DOSRAM 500. For example, the control portion 502 controls the driver 505, the main amplifier 506, and the input/output circuit 507.

The driver 505 is electrically connected to a plurality of wirings WL and CSEL. The driver 505 generates signals output to the plurality of wirings WL and CSEL.

The cell array 503 includes a plurality of memory cells 509. The memory cells 509 are electrically connected to wirings WL, LBL (or LBLB), and BGL. The wiring WL is a word line. The wirings LBL and LBLB are local bit lines. Although the cell array 503 has a folded bit line architecture in the example of FIG. 14A, it can alternatively employ an open bit line architecture.

FIG. 14B illustrates a configuration example of the memory cell 509. The memory cell 509 includes a transistor MW1 and a capacitor CS1. The memory cell 509 has a circuit configuration similar to that of a memory cell for DRAM. The transistor MW1 is a transistor having a back gate. The back gate of the transistor MW1 is electrically connected to the wiring BGL. A voltage Vbg_w1 is input to the wiring BGL.

The transistor MW1 is an OS transistor. The off-state current of an OS transistor is extremely low. Forming the memory cell 509 using an OS transistor can suppress leakage of charge from the capacitor CS1, resulting in less frequent refresh operation of the DOSRAM 500. The DOSRAM 500 can retain image data for a long time even when power supply is stopped. Moreover, by setting the voltage Vbg_w1 to a negative voltage, the threshold voltage of the transistor MW1 can be shifted to the positive side and thus the retention time of the memory cell 509 can be increased.

Transistors in the circuits other than the memory cells 509 can be, for example, Si transistors formed using a silicon wafer. Consequently, the cell array 503 can be stacked over the sense amplifier circuit 504. Thus, the circuit area of the DOSRAM 500 can be reduced, leading to a reduction in size of the AP 110.

The cell array 503 is stacked over the sense amplifier circuit 504. The sense amplifier circuit 504 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifier SA has a function of amplifying the potential difference between the wirings LBL and LBLB.

In the sense amplifier circuit 504, one wiring GBL is provided for four wirings LBL, and one wiring GBLB is provided for four wirings LBLB. However, the configuration of the sense amplifier circuit 504 is not limited to the configuration example of FIG. 14A.

The main amplifier 506 is connected to the sense amplifier circuit 504 and the input/output circuit 507. The main amplifier 506 has a function of amplifying the potential difference between the wirings GBL and GBLB. The main amplifier 506 is not necessarily provided.

The input/output circuit 507 has a function of outputting a potential corresponding to write data to the wirings GBL and GBLB or the main amplifier 506, and a function of reading potentials of the wirings GBL and GBLB or an output potential of the main amplifier 506 and outputting the potential(s) to the outside as data. The sense amplifier SA from which data is read and the sense amplifier SA to which data is written can be selected in accordance with a signal of the wiring CSEL. Consequently, there is no need to provide a selector circuit such as a multiplexer in the input/output circuit 507. Thus, the input/output circuit 507 can have a simple circuit configuration and a small occupied area.

<NOSRAM>

Next, a NOSRAM will be described in detail with reference to FIGS. 15A and 15B.

Figure 15A:
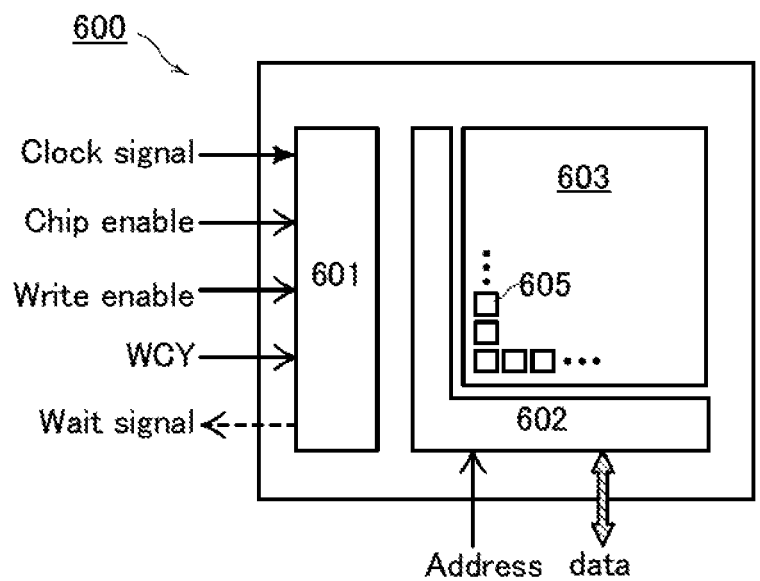
FIGS. 15A and 15B are a block diagram and a circuit diagram illustrating a configuration example of a NOSRAM.
Figure 15B:
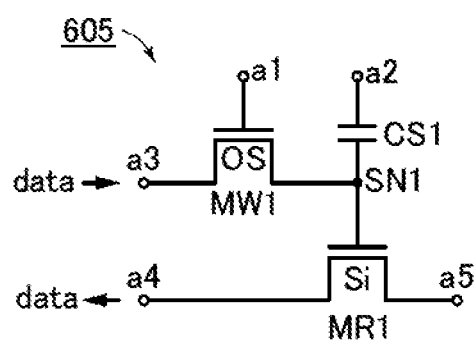

FIG. 15A is a block diagram illustrating a configuration example of a NOSRAM 600. The NOSRAM 600 shown in FIG. 15A includes a control portion 601, a driver portion 602, and a cell array 603.

The control portion 601 is a logic circuit having a function of controlling the entire operation of the NOSRAM 600. The control portion 601 has a function of performing logic operation of a chip enable signal and a write enable signal and determining whether access of the processor core 141 is write access or read access; a function of performing logic operation of a chip enable signal, a write enable signal, and a signal WCY and generating a control signal for the driver portion 602; and a function of issuing a wait signal on the basis of a write enable signal and the signal WCY.

With write access from the processor core 141, the control portion 601 issues a wait signal and sends it to the system bus 140. When the processor core 141 receives the wait signal, it delays execution of the next access.

A write enable signal is generated by the processor core 141. A chip enable signal is generated by the system bus 140. The system bus 140 generates a chip enable signal on the basis of an address signal and a write enable signal that are output from the processor core 141.

The driver portion 602 is a circuit for writing and reading data to/from the cell array 603. The driver portion 602 includes a decoder for decoding an address signal, a word line driver, a read circuit, and a write circuit, for example.

In the cell array 603, a plurality of memory cells 605 are arranged in a matrix. FIG. 15B illustrates a configuration example of the memory cell 605. Here, the memory cell 605 is a 2T gain cell. The memory cell 605 includes the transistor MW1, a transistor MR1, a capacitor CS1, a node SN1, and nodes a1 to a5. The transistor MW1 is an OS transistor serving as a write transistor. The transistor MR1 serves as a read transistor and is an n-channel Si transistor in the example of FIG. 15B. The node SN1 is a data retention node, and the capacitor CS1 is a storage capacitor for retaining charge of the node SN1.

To write data to the memory cell 605, data is input to the node a3. The node a1 is set to "H" to turn on the transistor MW1; thus, the data of the node a3 is written to the node SN1. The transistor MW1 is turned off to set the node SN1 in a floating state, whereby data writing is completed.

The voltage of the node a4 is read out as data. Data is read out in the following manner, for example. The potential of the node a5 is fixed. The node a4 is precharged and then set in a floating state. A drain current corresponding to the voltage of the node SN1 flows through the transistor MR1. Therefore, the voltage of the node a4 changes depending on the voltage of the node SN1.

The extremely low off-state current of the OS transistor can prevent a reduction in voltage of the node SN1 and enables data retention with no power consumption; thus, the memory cell 605 is nonvolatile (i.e., capable of retaining data for a long time). In view of this, OS memory with a cell array composed of gain cells is called NOSRAM in this specification and the like. NOSRAM has the following features in addition to long-term data retention.

Data is rewritten by charging and discharging of the capacitor; therefore, there is theoretically no limitation on rewrite cycles of NOSRAM, and data can be written to and read from NOSRAM with low energy. Owing to a simple circuit configuration of memory cells, the capacity of NOSRAM can be easily increased.

<Display Panel 101>

Next, the display panel 101 will be described in detail.

Figure 16:
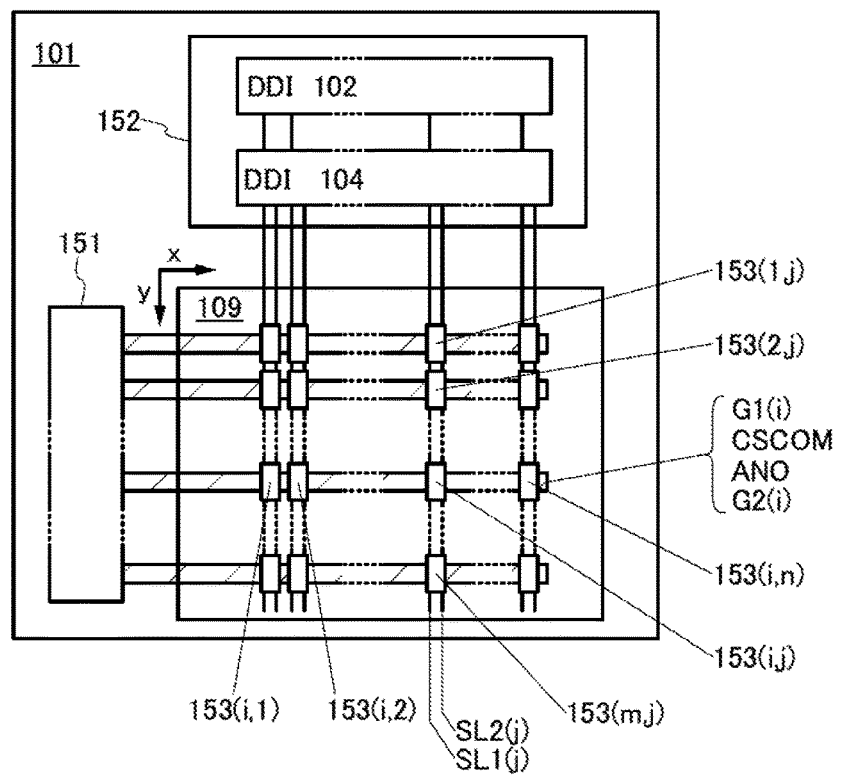
FIG. 16 is a block diagram illustrating a configuration example of a display panel.

FIG. 16 is a block diagram illustrating a configuration example of the display panel 101.

The display panel 101 includes a pixel array 109 and can also include a gate driver 151.

The pixel array 109 includes one group of pixels 153($i$,1) to 153($i$,$n$), another group of pixels 153(1,$j$) to 153($m$,$j$), a scan line G1($i$), a scan line G2($i$), a wiring CSCOM, a wiring ANO, and a signal line SL2($j$). Note that each of m and n is an integer of 1 or more, i is an integer of 1 to m, and j is an integer of 1 to n.

The group of pixels 153($i$,1) to 153($i$,$n$) include the pixel 153($i$,$j$) and are provided in the row direction (the direction indicated by the arrow x in FIG. 16).

The another group of pixels 153(1,$j$) to 153($m$,$j$) include the pixel 153($i$,$j$) and are provided in the column direction (the direction indicated by the arrow y in FIG. 16) that intersects the row direction.

The scan line G1($i$) and the scan line G2($i$) are electrically connected to the group of pixels 153($i$,1) to 153($i$,$n$) arranged in the row direction.

The group of the pixels 153(1,$j$) to 153($m$,$j$) arranged in the column direction are electrically connected to the signal line SL1($j$) and the signal line SL2($j$).

The gate driver 151 has a function of supplying a selection signal on the basis of control information.

For example, the gate driver 151 has a function of supplying a selection signal to one scan line at a frequency of 30 Hz or higher, preferably 60 Hz or higher, on the basis of control information. Accordingly, moving images can be smoothly displayed.

For example, the gate driver 151 has a function of supplying a selection signal to one scan line at a frequency of lower than 30 Hz, preferably lower than 1 Hz, more preferably less than once per minute, on the basis of control information. Accordingly, a still image can be displayed while flickering is suppressed.

The DDI 152 includes the DDI 102 and the DDI 104. The DDI 104 functions as a source driver of the display panel 101. The DDI 102 has a function of supplying a data signal on the basis of a signal from the AP 110.

For example, the DDI 152 can be configured with an integrated circuit formed on a silicon substrate. The integrated circuit can be mounted on a terminal, for example, by a chip on glass (COG) method or a chip on film (COF) method, specifically by using an anisotropic conductive film.

<Pixel 153>

Figure 17:
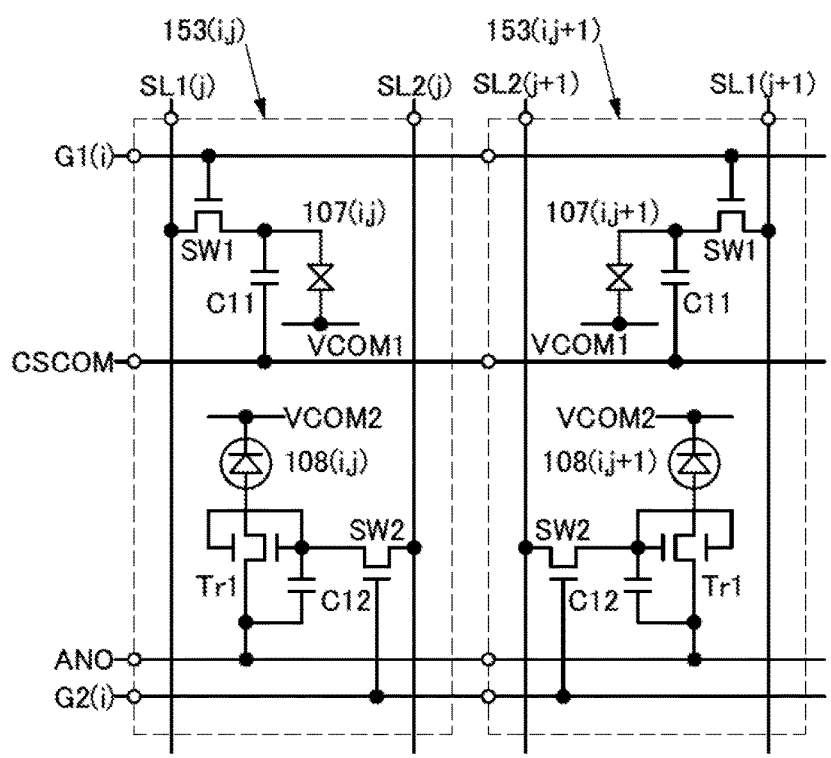
FIG. 17 is a circuit diagram illustrating a configuration example of a pixel.

FIG. 17 is a circuit diagram illustrating a configuration example of the pixel 153. The pixel 153($i$,$j$) has a function of driving a reflective element 107($i$,$j$) and a light-emitting element 108($i$,$j$). Accordingly, the reflective element 107 and the light-emitting element 108, which performs display by a method different from that for the reflective element 107, can be driven with one pixel circuit, for example. With the use of the reflective element 107, display can be performed with lower power consumption, or images with high contrast can be favorably displayed in an environment with bright external light. With the use of the light-emitting element 108, images can be favorably displayed in a dark environment.

The pixel 153($i$,$j$) is electrically connected to the signal line SL1($j$), the signal line SL2($j$), the scan line G1($i$), the scan line G2($i$), the wiring CSCOM, and the wiring ANO.

The pixel 153($i$,$j$) includes a switch SW1, a capacitor C11, a switch SW2, a transistor Tr1, and a capacitor C12.

For example, a transistor having a gate electrode electrically connected to the scan line G1($i$) and a first electrode electrically connected to the signal line SL1($j$) can be used as the switch SW1.

The capacitor C11 has a first electrode electrically connected to a second electrode of the transistor used as the switch SW1 and a second electrode electrically connected to the wiring CSCOM.

A transistor having a gate electrode electrically connected to the scan line G2($i$) and a first electrode electrically connected to the signal line SL2($j$) can be used as the switch SW2.

The transistor Tr1 has a gate electrode electrically connected to a second electrode of the transistor used as the switch SW2 and a first electrode electrically connected to the wiring ANO.

Note that the transistor Tr1 may have a first gate electrode and a second gate electrode. The first gate electrode and the second gate electrode may be electrically connected to each other. The first gate electrode and the second gate electrode preferably have regions overlapping each other with a semiconductor film positioned therebetween.

The capacitor C12 has a first electrode electrically connected to the second electrode of the transistor used as the switch SW2 and a second electrode electrically connected to the first electrode of the transistor Tr1.

A first electrode of the reflective element 107($i$,$j$) is electrically connected to the second electrode of the transistor used as the switch SW1. A second electrode of the reflective element 107($i$,$j$) is electrically connected to a wiring VCOM1. Accordingly, the reflective element 107($i$,$j$) can be driven.

A first electrode of the light-emitting element 108($i$,$j$) is electrically connected to the second electrode of the transistor Tr1. A second electrode of the light-emitting element 108($i$,$j$) is electrically connected to a wiring VCOM2. Accordingly, the light-emitting element 108($i$,$j$) can be driven.

<Cross-Sectional View of Display Panel>

Next, a structure example of the display panel 101 will be described with reference to a cross-sectional view in FIG. 18.

Figure 18:
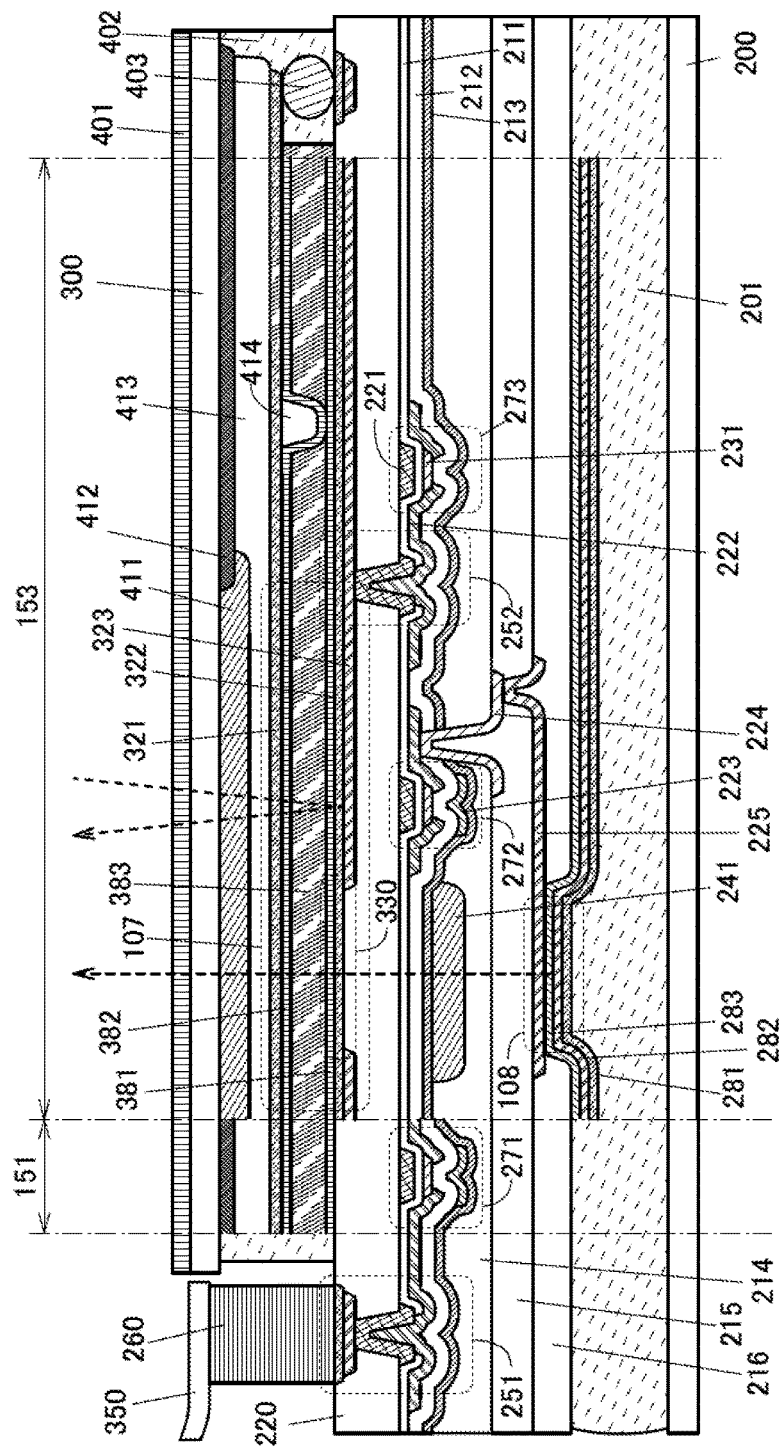
FIG. 18 is a cross-sectional view illustrating a structure example of a display panel.

The display panel 101 illustrated in FIG. 18 includes an insulating layer 220 between a substrate 200 and a substrate 300. The display panel 101 includes the light-emitting element 108, a transistor 271, a transistor 272, a transistor 273, a coloring layer 241, and the like between the substrate 200 and the insulating layer 220. Furthermore, the display panel 101 includes the reflective element 107, a coloring layer 411, and the like between the insulating layer 220 and the substrate 300. The substrate 300 and the insulating layer 220 are bonded with an adhesive layer 402. The substrate 200 and the insulating layer 220 are bonded with an adhesive layer 201.

For the substrate 200, non-alkali glass, soda-lime glass, potash glass, lead glass, aluminosilicate glass, tempered glass, chemically tempered glass, quartz, sapphire, or the like can be used.

As the substrate 200, a single crystal semiconductor substrate or a polycrystalline semiconductor substrate of silicon or silicon carbide, a compound semiconductor substrate of silicon germanium or the like, or an SOI substrate can be used.

For the substrate 200, a composite material formed by attaching a metal plate, a thin glass plate, or a film of an inorganic material or the like to a resin film or the like can be used.

For the substrate 200, a composite material formed by dispersing a fibrous or particulate metal, glass, an inorganic material, or the like into a resin film can be used.

For the substrate 200, a composite material formed by dispersing a fibrous or particulate resin, an organic material, or the like into an inorganic material can be used, for example.

For the substrate 300, any of the above materials applicable to the substrate 200 can be used.

Note that the substrate 200 or the substrate 300 may be provided with electrodes to have a touch panel function.

The transistor 273 is electrically connected to the reflective element 107. The transistor 272 is electrically connected to the light-emitting element 108. The transistors 272 and 273 are formed on a surface on the substrate 200 side of the insulating layer 220, so that these transistors can be formed through the same process.

The substrate 300 is provided with the coloring layer 411, a light-blocking layer 412, an insulating layer 413, a conductive layer 321 functioning as a common electrode of the reflective element 107, an alignment film 382, an insulating layer 414, and the like. The insulating layer 414 has a function of holding a cell gap of the reflective element 107.

Insulating layers such as an insulating layer 211, an insulating layer 212, an insulating layer 213, an insulating layer 214, and an insulating layer 215 are provided on the substrate 200 side of the insulating layer 220. Part of the insulating layer 211 functions as a gate insulating layer of each transistor. The insulating layers 212, 213, and 214 are provided to cover each transistor. The insulating layer 215 is provided to cover the insulating layer 214. The insulating layers 214 and 215 each function as a planarization layer. Note that here, the three insulating layers 212, 213, and 214 are provided to cover the transistors and the like; however, one embodiment of the present invention is not limited to this example, and four or more insulating layers, a single insulating layer, or two insulating layers may be provided. The insulating layer 214 functioning as a planarization layer is not necessarily provided when not needed.

The transistor 271, the transistor 272, and the transistor 273 each include a conductive layer 221 part of which functions as a gate, conductive layers 222 part of which functions as a source and a drain, and a semiconductor layer 231. Here, a plurality of layers obtained by processing one conductive film are shown with the same hatching pattern.

The reflective element 107 is a reflective liquid crystal element. The reflective element 107 has a stacked structure of a conductive layer 322, liquid crystal 383, and the conductive layer 321. A conductive layer 323 that reflects visible light is provided in contact with the conductive layer 322 on the substrate 200 side. The conductive layer 323 has an opening 330. The conductive layers 321 and 322 transmit visible light. An alignment film 381 is provided between the liquid crystal 383 and the conductive layer 322, and the alignment film 382 is provided between the liquid crystal 383 and the conductive layer 321. A polarizing plate 401 is provided on an outer surface of the substrate 300.

In the reflective element 107, the conductive layer 323 has a function of reflecting visible light, and the conductive layer 321 has a function of transmitting visible light. Light entering from the substrate 300 side is polarized by the polarizing plate 401, passes through the conductive layer 321 and the liquid crystal 383, and is reflected by the conductive layer 323. Then, the light passes through the liquid crystal 383 and the conductive layer 321 again and reaches the polarizing plate 401. At this time, alignment of the liquid crystal is controlled with a voltage that is applied between the conductive layer 323 and the conductive layer 321, and thus optical modulation of light can be controlled. That is, the intensity of light emitted through the polarizing plate 401 can be controlled. Light excluding light in a particular wavelength region is absorbed by the coloring layer 411, and thus, emitted light is red light, for example.

The light-emitting element 108 is a bottom-emission light-emitting element. The light-emitting element 108 has a structure in which a conductive layer 225, a conductive layer 283, and a conductive layer 282 are stacked in this order from the insulating layer 220 side. The insulating layer 216 covers an end portion of the conductive layer 225. A conductive layer 281 is provided to cover the conductive layer 282. The conductive layer 281 contains a material reflecting visible light, and the conductive layers 225 and 282 contain a material transmitting visible light. Light is emitted from the light-emitting element 108 to the substrate 300 side through the coloring layer 241, the insulating layer 220, the opening 330, the conductive layer 321, and the like.

Here, as illustrated in FIG. 18, the conductive layer 322 transmitting visible light is preferably provided in the opening 330. Accordingly, the liquid crystal 383 in a region overlapping the opening 330 is aligned in a similar manner as in the other regions, preventing undesired light leakage caused by an alignment defect of the liquid crystal in the boundary portion of the region overlapping the opening 330 and the other regions.

As the polarizing plate 401 provided on the outer surface of the substrate 300, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, driving voltage, and the like of the liquid crystal element used as the reflective element 107 are controlled in accordance with the type of the polarizing plate so that desirable contrast is obtained. When a light diffusion plate is provided over the substrate 300 in addition to the polarizing plate 401, reflection or glare in the conductive layer 323 that reflects visible light can be reduced, leading to an increase in visibility of the display panel.

One of the source and the drain of the transistor 272 is electrically connected to the conductive layer 225 of the light-emitting element 108 through a conductive layer 224.

One of the source and the drain of the transistor 273 is electrically connected to the conductive layer 323 through a connection portion 252. The conductive layers 322 and 323 are in contact with and electrically connected to each other. In the connection portion 252, the conductive layers provided on both surfaces of the insulating layer 220 are connected to each other through an opening in the insulating layer 220.

A connection portion 251 is provided in a region where the substrate 200 and the substrate 300 do not overlap. The connection portion 251 is electrically connected to an FPC 350 through a connection layer 260. A conductive layer obtained by processing the same conductive film as the conductive layer 322 is exposed at a top surface of the connection portion 251. Thus, the connection portion 251 can be electrically connected to the FPC 350 through the connection layer 260.

A connector 403 is provided in part of a region where the adhesive layer 402 is provided. A conductive layer obtained by processing the same conductive film as the conductive layer 322 is electrically connected to part of the conductive layer 321 through the connector 403. Accordingly, a signal or a potential input from the FPC 350 connected to the substrate 200 side can be supplied to the conductive layer 321 formed on the substrate 300 side through the connector 403.

As the connector 403, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. For the connector 403, a material capable of elastic deformation or plastic deformation is preferably used. The connector 403, which is the conductive particle, sometimes has a shape that is squeezed vertically as illustrated in FIG. 18. With the connector 403 having the squeezed shape, the contact area between the connector 403 and a conductive layer electrically connected to the connector 403 can be increased, thereby reducing contact resistance and suppressing defects such as disconnection.

The connector 403 is preferably provided to be covered with the adhesive layer 402. For example, the connector 403 is dispersed in the adhesive layer 402 before the adhesive layer 402 is cured.

FIG. 18 illustrates an example where the gate driver 151 includes the transistor 271.

In FIG. 18, the transistors 271 and 272 employ a structure in which the semiconductor layer 231 where a channel is formed is provided between two gates. One of the gates is formed of the conductive layer 221, and the other gate is formed of a conductive layer 223 that overlaps with the semiconductor layer 231 with the insulating layer 212 placed therebetween. Such a structure enables control of the threshold voltage of the transistor. In that case, the two gates may be connected to each other and supplied with the same signal so that the transistor operates. Such a transistor can have higher field-effect mobility and thus have higher on-state current than other transistors. As a result, a circuit capable of high-speed operation is obtained. Moreover, the area occupied by a circuit portion can be reduced. The use of the transistor having high on-state current can reduce signal delay in wirings and can reduce display unevenness even in a display panel in which the number of wirings is increased because of the increase in size or resolution.

The transistors 271, 272, and 273 are preferably OS transistors; therefore, the semiconductor layer 231 is preferably formed using an oxide semiconductor or a metal oxide.

Note that the transistors included in the gate driver 151 and the transistors included in the pixel 153 may have the same structure. A plurality of transistors included in the gate driver 151 may have the same structure or different structures. A plurality of transistors included in the pixel 153 may have the same structure or different structures.

A material through which impurities such as water or hydrogen do not easily diffuse is preferably used for at least one of the insulating layers 212 and 213 that cover the transistors. That is, the insulating layer 212 or the insulating layer 213 can function as a barrier film. Such a structure can effectively suppress diffusion of impurities into the transistors from the outside, and a highly reliable display panel can be provided.

The insulating layer 413 is provided on the substrate 300 side to cover the coloring layer 411 and the light-blocking layer 412. The insulating layer 413 may have a function of a planarization layer. The insulating layer 413 enables the conductive layer 321 to have an almost flat surface, resulting in a uniform alignment state of the liquid crystal 383.

An example of a method for manufacturing the display panel 101 will be described. For example, the conductive layer 322, the conductive layer 323, and the insulating layer 220 are formed in this order over a supporting substrate provided with a separation layer, and then the transistor 272, the transistor 273, the light-emitting element 108, and the like are formed. Subsequently, the substrate 200 and the supporting substrate are bonded with the adhesive layer 201. After that, separation is performed at the interface between the separation layer and each of the insulating layer 220 and the conductive layer 322, whereby the support substrate and the separation layer are removed. Separately, the substrate 300 provided with the coloring layer 411, the light-blocking layer 412, the conductive layer 321, and the like is prepared. Then, the liquid crystal 383 is dropped onto the substrate 200 or the substrate 300, and the substrate 200 and the substrate 300 are bonded with the adhesive layer 402, whereby the display panel 101 can be manufactured.

A material for the separation layer can be selected such that separation at the interface with the insulating layer 220 and the conductive layer 322 occurs. Preferably, the separation layer is a stack of a layer containing a high-melting-point metal material (e.g., tungsten) and a layer containing an oxide of the metal material, and the insulating layer 220 over the separation layer is a stack of a plurality of layers, such as a silicon nitride layer, a silicon oxynitride layer, and a silicon nitride oxide layer. The use of the high-melting-point metal material for the separation layer can increase the formation temperature of layers formed in later steps, which reduces impurity concentration and achieves a highly reliable display device.

For the conductive layer 322, an oxide or a nitride such as a metal oxide, a metal nitride, or an oxide semiconductor whose resistance is reduced is preferably used.

In the case of using an oxide semiconductor, the conductive layer 322 is formed using a material in which at least one of the concentrations of hydrogen, boron, phosphorus, nitrogen, and other impurities and the amount of oxygen vacancies is made to be higher than that in a semiconductor layer of a transistor.

With use of the display device of one embodiment of the present invention, a display device with low power consumption and high visibility can be provided.

At least part of this embodiment can be implemented in combination with any of the other embodiments and the other examples described in this specification as appropriate.

Embodiment 3

In this embodiment, a display module for which the display device described in Embodiment 2 can be used will be described.

The display module for which the display device described in Embodiment 2 can be used is described with reference to FIG. 19. The display module can reduce power consumption in the display_IF and perform high-speed switching in boosting a voltage to a desired voltage.

Figure 19:
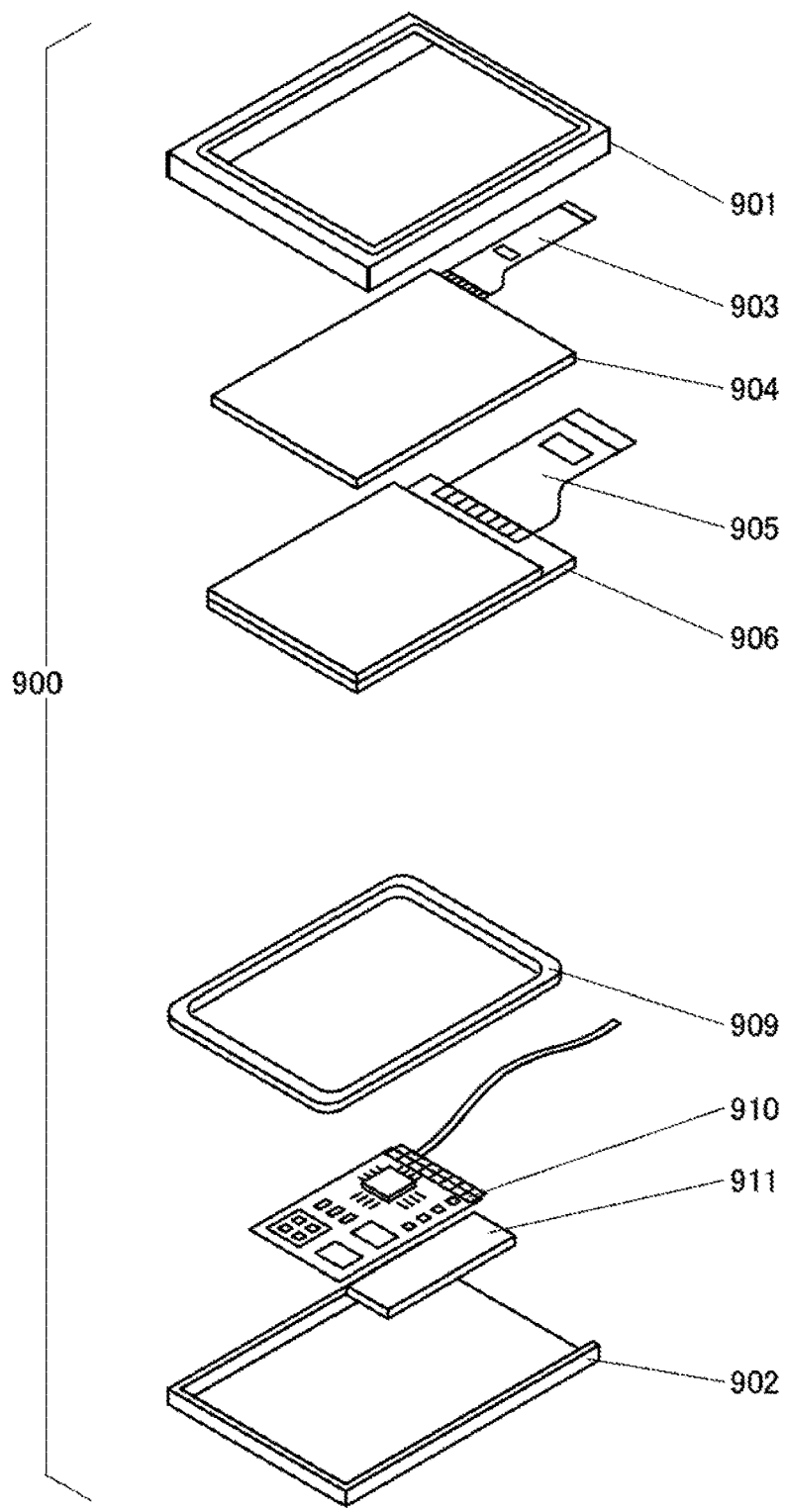
FIG. 19 illustrates an example of a display module.

In a display module 900 illustrated in FIG. 19, a touch panel 904 connected to an FPC 903, a display panel 906 connected to an FPC 905, a frame 909, a printed board 910, and a battery 911 are provided between an upper cover 901 and a lower cover 902.

The display panel described in Embodiment 2 can be used as the display panel 906, for example.

The shapes and sizes of the upper cover 901 and the lower cover 902 can be changed as appropriate in accordance with the sizes of the touch panel 904 and the display panel 906.

The touch panel 904 can be a resistive touch panel or a capacitive touch panel and can be stacked over the display panel 906. A counter substrate (sealing substrate) of the display panel 906 can have a touch panel function. Further alternatively, a photosensor can be provided in each pixel of the display panel 906 so that an optical touch panel is obtained.

The frame 909 protects the display panel 906 and functions as an electromagnetic shield for blocking electromagnetic waves generated by the operation of the printed board 910. The frame 909 may also function as a radiator plate.

The printed board 910 includes a power supply circuit and a signal processing circuit for outputting a video signal and a clock signal. As a power source for supplying power to the power supply circuit, an external commercial power source or the battery 911 provided separately may be used. The battery 911 can be omitted in the case of using a commercial power source.

The display module 900 may be additionally provided with a polarizing plate, a retardation plate, a prism sheet, or the like.

At least part of this embodiment can be implemented in combination with any of the other embodiments described in this specification as appropriate.

Embodiment 4

In this embodiment, examples of an electronic device including the display module described in the above embodiment is described with reference to FIGS. 20A to 20E.

The display module described in the above embodiment can include the semiconductor device described in the above embodiment. Thus, an electronic device which can reduce power consumption and can perform high-speed switching in boosting a voltage to a desired voltage can be obtained.

As examples of an electronic device, the description is made on the case where the above-described display module is used in a computer, a portable information terminal (including a mobile phone, a portable game machine, and an audio reproducing device), electronic paper, a television device (also referred to as a television or a television receiver), a digital video camera, or the like.

Figure 20A:
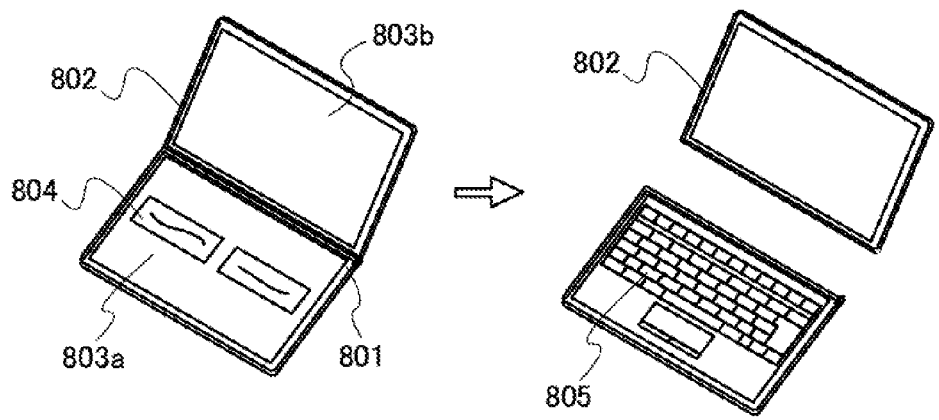
FIGS. 20A to 20E each show an example of an electronic device.

FIG. 20A illustrates a portable information terminal that includes a housing 801, a housing 802, a first display portion 803a, a second display portion 803b, and the like. The display module described in the above embodiment is provided in at least part of the first display portion 803a and the second display portion 803b. Thus, a portable information terminal which can reduce power consumption and can perform high-speed switching in boosting a voltage to a desired voltage can be obtained.

Note that the first display portion 803a is a touch panel, and for example, as illustrated in the left of FIG. 20A, which of "touch input" and "keyboard input" is performed can be selected by a selection button 804 displayed on the first display portion 803a. Because the selection buttons with a variety of sizes can be displayed, the portable information terminal can be easily used by people of any generation. In the case where "keyboard input" is selected, for example, a keyboard 805 is displayed on the first display portion 803a as illustrated in the right of FIG. 20A. With the keyboard 805, letters can be input quickly by keyboard input as in the case of using a conventional information terminal, for example.

One of the first display portion 803a and the second display portion 803b can be detached from the portable information terminal as illustrated in the right of FIG. 20A. Providing the second display portion 803b with a touch input function makes the information terminal convenient to carry because the weight can be further reduced and to operate with one hand while the other hand supports the housing 802.

The portable information terminal in FIG. 20A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 20A may transmit and receive data wirelessly. Through wireless communication, desired book data or the like can be purchased and downloaded from an electronic book server.

Furthermore, the housing 802 in FIG. 20A may have an antenna, a microphone function, or a wireless communication function to be used as a cellular phone.

Figure 20B:
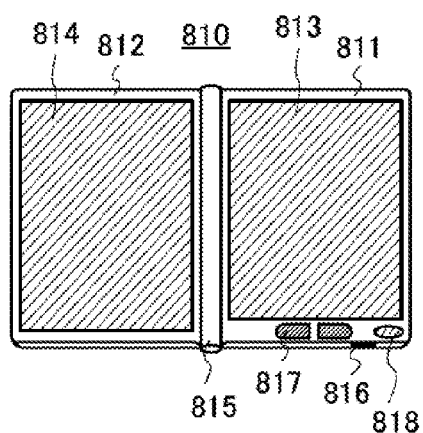

FIG. 20B illustrates an e-book reader 810 including electronic paper. The e-book reader 810 includes two housings 811 and 812. The housings 811 and 812 include a display portion 813 and a display portion 814, respectively. The housings 811 and 812 are connected to each other by a hinge 815, so that the e-book reader 810 can be opened and closed using the hinge 815 as an axis. The housing 811 includes a power button 816, operation keys 817, a speaker 818, and the like. The above-described display module is provided in at least one of the display portions 813 and 814. Thus, an e-book reader which can reduce power consumption and can perform high-speed switching in boosting a voltage to a desired voltage can be obtained.

Figure 20C:
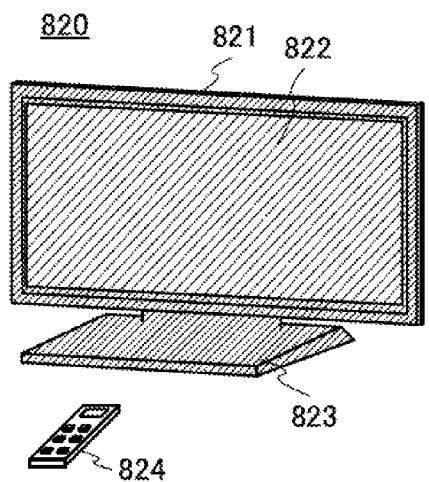

FIG. 20C illustrates a television device including a housing 821, a display portion 822, a stand 823, and the like. A television device 820 can operate with a switch of the housing 821 and a remote controller 824. The display module described in the above embodiment is provided in the display portion 822. Thus, a television device which can reduce power consumption and can perform high-speed switching in boosting a voltage to a desired voltage can be obtained.

Figure 20D:
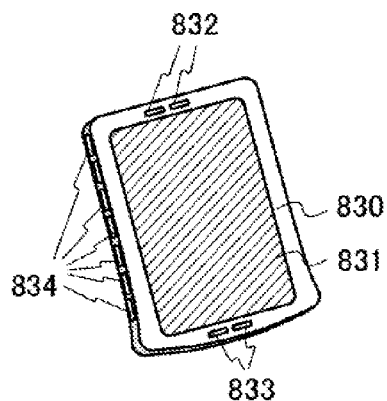

FIG. 20D illustrates a smartphone in which a main body 830 includes a display portion 831, a speaker 832, a microphone 833, operation buttons 834, and the like. The display module described in the above embodiment is provided in the display portion 831. Thus, a smartphone which can reduce power consumption and can perform high-speed switching in boosting a voltage to a desired voltage can be obtained.

Figure 20E:
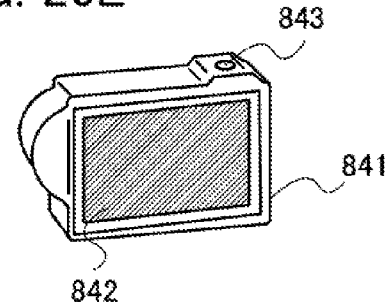

FIG. 20E illustrates a digital camera including a main body 841, a display portion 842, an operation switch 843, and the like. The display module described in the above embodiment is provided in the display portion 842. This allows the digital camera to be less likely to malfunction and to have lower power consumption.

As described above, the display module according to the above embodiment can be provided in the display portion of the electronic device shown in this embodiment. Thus, an electronic device which can reduce power consumption and can perform high-speed switching in boosting a voltage to a desired voltage can be obtained.

EXAMPLE

Circuit simulation was performed on the semiconductor device having the structure in FIG. 1B described in the above embodiment. Circuit simulation was also performed on a cross-coupled level shift circuit in order to compare with the semiconductor device of one embodiment of the present invention.

Figure 23A:
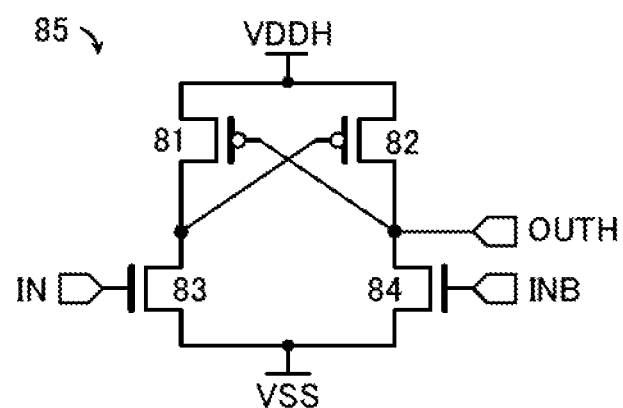
FIGS. 23A and 23B are circuit diagrams used to describe an example.
Figure 23B:
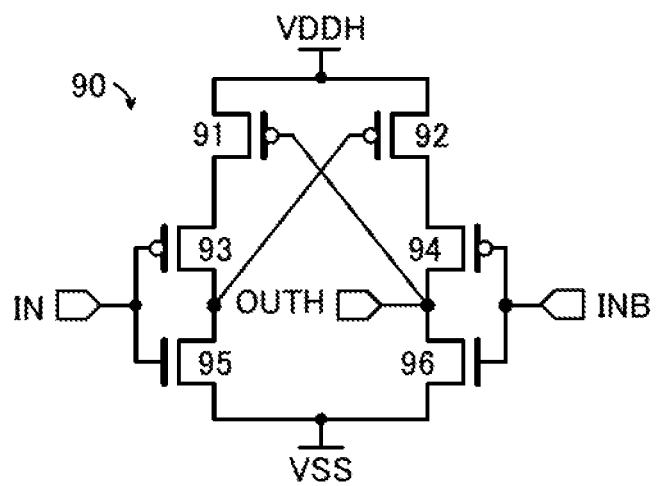

FIGS. 23A and 23B each show a cross-coupled level shift circuit. A level shift circuit 85 shown in FIG. 23A includes transistors 81 to 84 and is supplied with the output signal OUTH which is obtained by boosting the input signal IN and the inverted signal INB which are input. A level shift circuit 90 shown in FIG. 23B includes transistors 91 to 96 and is supplied with the output signal OUTH which is obtained by boosting the input signal IN and the inverted signal INB which are input.

Figure 21:
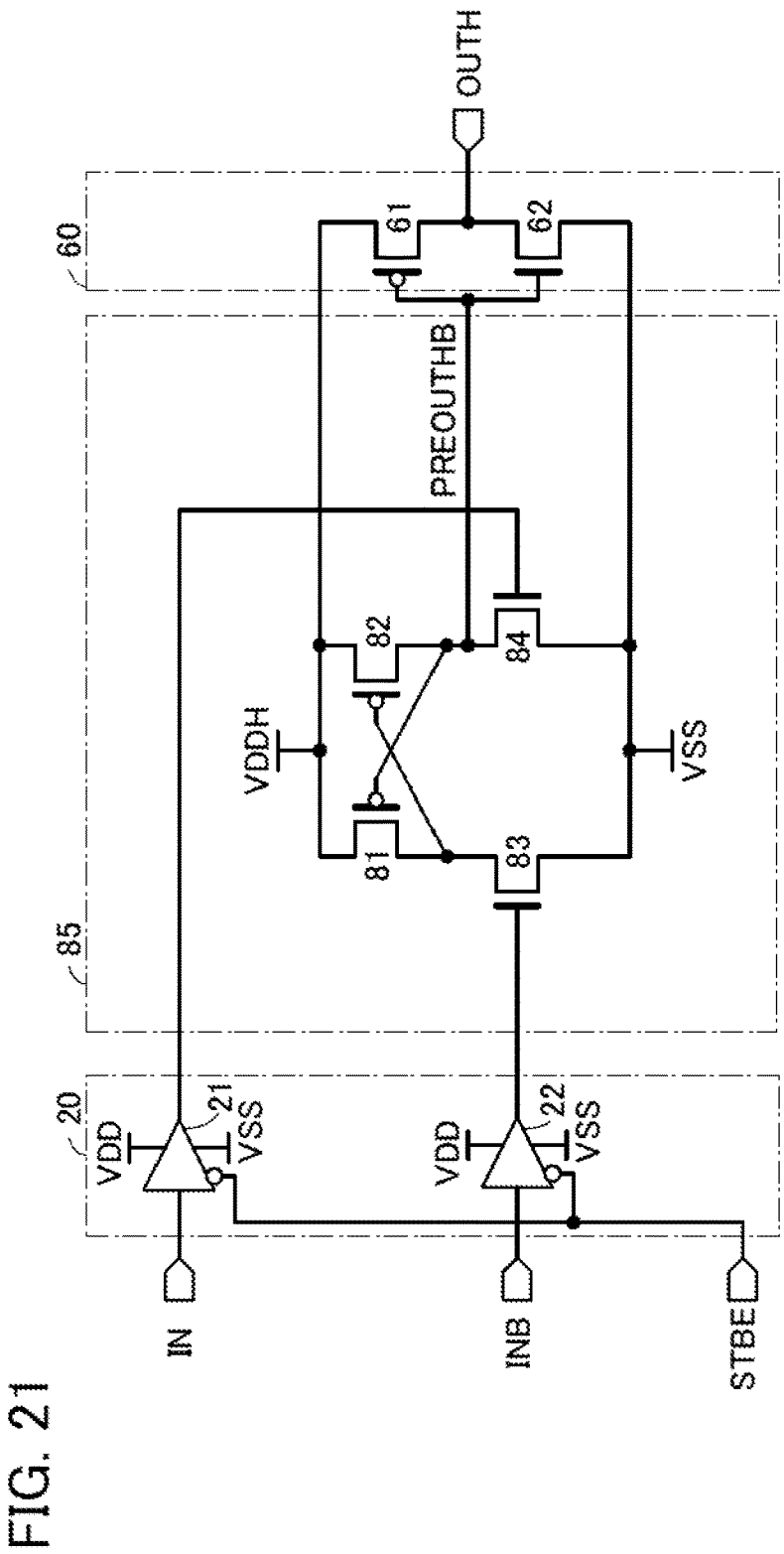
FIG. 21 is a circuit diagram illustrating an example.

FIG. 21 shows a circuit diagram in which the cross-coupled level shift circuit 85 shown in FIG. 23A is the level shift circuit 40 in FIG. 1B. In the circuit simulation, the input signal IN and the inverted input signal INB are input to each of the circuits in FIG. 1B and FIG. 21 and change in the voltage of the node PREOUTHB and that in the output signal OUTH were estimated. Note that a circuit simulator, Smart Spice (manufactured by Silvaco Data Systems Inc.), was used for the simulation. Note that the voltage VDDH was 3.3 V, the voltage VDD was 1.2 V, and the voltage VSS was 0 V.

Figure 22A:
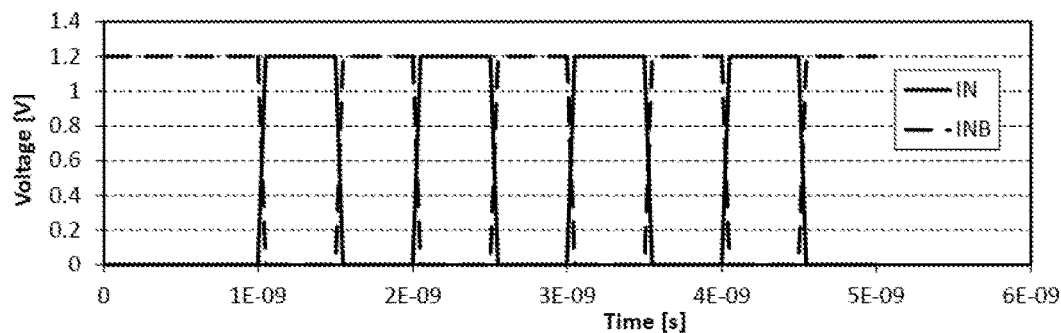
FIGS. 22A to 22C show waveform charts for describing an example.

FIG. 22A shows a waveform chart of the input signal IN and the inverted input signal INB, in which the horizontal axis and the vertical axis represent time and voltage, respectively. In FIG. 22A, the input signal IN is shown by a solid line and the inverted input signal INB is shown by a dashed line.

As shown in FIG. 22A, the logics of the input signal IN and the inverted input signal INB are inverted from each other.

Figure 22B:
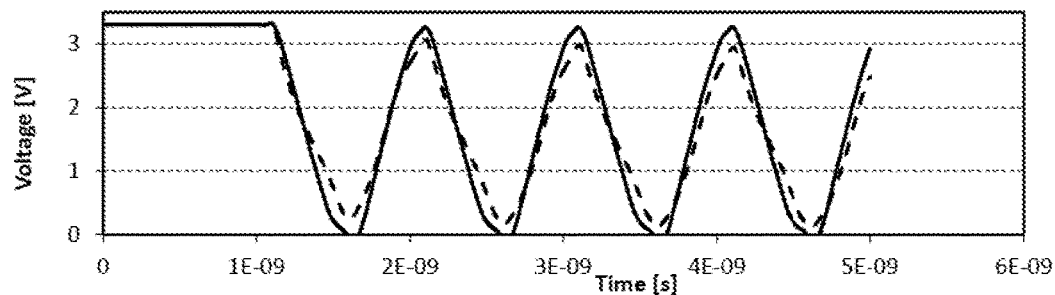

FIG. 22B shows a waveform chart of a change in the voltage of the node PREOUTHB in FIG. 1B and a change in the voltage of the node PREOUTHB in FIG. 21, in which the horizontal axis and the vertical axis represent time and voltage, respectively. In FIG. 22B, the change in the voltage of the node PREOUTHB in FIG. 1B is shown by a solid line and the change in the voltage of the node PREOUTHB in FIG. 21 is shown by a dashed line.

As shown in FIG. 22B, the amplitude voltage of the node PREOUTHB in FIG. 1B is larger than that of the node PREOUTHB in FIG. 21.

Figure 22C:
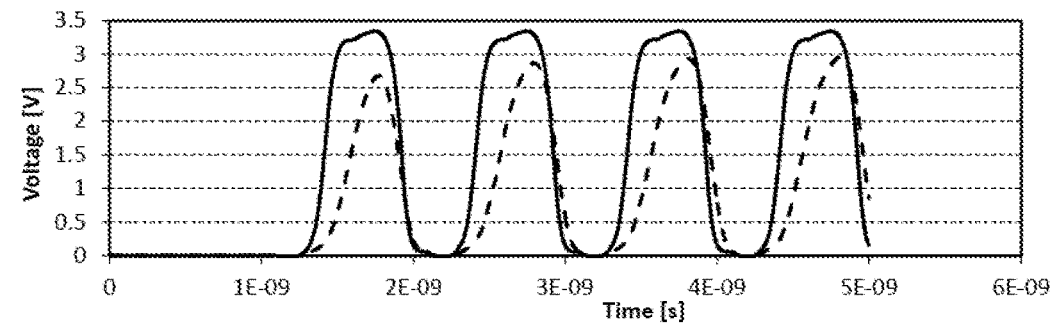

FIG. 22C shows a waveform chart of the output signal OUTH in FIG. 1B and the output signal OUTH in FIG. 21, in which the horizontal axis and the vertical axis represent time and voltage, respectively. In FIG. 22C, the output signal OUTH in FIG. 1B is shown by a solid line and the output signal OUTH in FIG. 21 is shown by a dashed line.

As shown in FIG. 22C, the amplitude voltage of the output signal OUTH in FIG. 1B is larger than that of the output signal OUTH in FIG. 21, which indicates that rising and falling of the signal are favorable.

This application is based on Japanese Patent Application Serial No. 2016-171508 filed with Japan Patent Office on Sep. 2, 2016, the entire contents of which are hereby incorporated by reference.

What is claimed is:

1. A semiconductor device comprising:
a first buffer circuit and a second buffer circuit; and
a level-shift circuit between the first buffer circuit and the second buffer circuit,
wherein the first buffer circuit comprises a tri-state buffer circuit configured to make each of an output of an input signal and an output of an inverted input signal into a resting state in response to a standby signal,
wherein the level-shift circuit comprises:
a current mirror circuit;
a differential amplifier circuit configured to control a current flowing through the current mirror circuit in response to the input signal and the inverted input signal; and
a switch circuit configured to make a current flowing through the differential amplifier circuit into a resting state in response to the standby signal,
wherein an amplitude voltage of the standby signal is smaller than an amplitude voltage of an output signal of the second buffer circuit.

2. The semiconductor device according to claim 1,
wherein each of the differential amplifier circuit and the switch circuit comprise a n-channel transistor, and
wherein the current mirror circuit comprises a p-channel transistor.

3. The semiconductor device according to claim 1,
wherein the standby signal comprises:
a first standby signal input to the tri-state buffer circuit; and
a second standby signal input to the switch circuit, and
wherein an amplitude voltage of the first standby signal is smaller than an amplitude voltage of the second standby signal.

4. The semiconductor device according to claim 1, wherein the second buffer circuit is configured to output the output signal generated by boosting the input signal in response to the current flowing through the current mirror circuit.

5. A display module comprising:
a display interface comprising the semiconductor device according to claim 1; and
a display panel.

6. An electronic device comprising:
the display module according to claim 5; and
an operation button.

7. A semiconductor device comprising:
a first buffer circuit and a second buffer circuit; and
a level-shift circuit between the first buffer circuit and the second buffer circuit,
wherein the first buffer circuit comprises a first tri-state buffer circuit and a second tri-state buffer circuit,
wherein the level-shift circuit comprises:
a current mirror circuit;
a differential amplifier circuit comprising a first transistor and a second transistor; and
a switch circuit comprising a third transistor and a fourth transistor,
wherein the first tri-state buffer circuit is electrically connected to a gate of the first transistor, one of a source and a drain of the third transistor, and a signal line to which a standby signal is supplied, wherein the second tri-state buffer circuit is electrically connected to a gate of the second transistor, one of a source and a drain of the fourth transistor, and the signal line to which the standby signal is supplied, and wherein a gate of the third transistor and a gate of the fourth transistor are electrically connected to the signal line to which the standby signal is supplied.

8. The semiconductor device according to claim 7, wherein one of a source and a drain of the first transistor is electrically connected to one of a source and a drain of the second transistor, the other of the source and the drain of the third transistor, and the other of the source and the drain of the fourth transistor.

9. The semiconductor device according to claim 8, wherein the current mirror circuit comprises a fifth transistor and a sixth transistor, wherein a gate of the fifth transistor is electrically connected to a gate of the sixth transistor, one of a source and a drain of the sixth transistor, and the other of the source and the drain of the second transistor, wherein one of a source and a drain of the fifth transistor is electrically connected to the other of the source and the drain of the first transistor, and wherein the other of the source and the drain of the fifth transistor is electrically connected to the other of the source and the drain of the sixth transistor.

10. The semiconductor device according to claim 7, wherein the switch circuit further comprises a seventh transistor, wherein a gate of the seventh transistor is electrically connected to the signal line to which the standby signal is supplied, wherein one of a source and a drain of the seventh transistor is electrically connected to the current mirror circuit, and wherein the other of the source and the drain of the seventh transistor is electrically connected to the other of the source and the drain of the third transistor and the other of the source and the drain of the fourth transistor.

11. The semiconductor device according to claim 8, wherein the second buffer circuit comprises an eighth transistor and a ninth transistor, wherein a gate of the eighth transistor and a gate of the ninth transistor are electrically connected the differential amplifier circuit, wherein one of a source and a drain of the eighth transistor is electrically connected to the current mirror circuit, wherein one of a source and a drain of the ninth transistor is electrically connected to the one of the source and the drain of each of the first transistor and the second transistor, and the other of the source and the drain of each of the third transistor and the fourth transistor, and wherein the other of the source and the drain of the eighth transistor is electrically connected to the other of the source and the drain of the ninth transistor.

12. The semiconductor device according to claim 7, wherein each of the first transistor, the second transistor, the third transistor, and the fourth transistor is a n-channel transistor.

13. The semiconductor device according to claim 7, wherein the current mirror circuit comprises a fifth transistor and a sixth transistor, and wherein each of the fifth transistor and the sixth transistor is a p-channel transistor.

14. The semiconductor device according to claim 7, wherein an amplitude voltage of the standby signal is smaller than an amplitude voltage of an output signal of the second buffer circuit.

15. The semiconductor device according to claim 7, wherein the standby signal comprises:
a first standby signal input to the first tri-state buffer circuit and the second tri-state buffer circuit; and
a second standby signal input to the switch circuit, and
wherein an amplitude voltage of the first standby signal is smaller than an amplitude voltage of the second standby signal.

16. The semiconductor device according to claim 7, wherein the second buffer circuit is configured to output an output signal generated by boosting a signal output from the first tri-state buffer circuit, in response to a current flowing through the current mirror circuit.

17. A display module comprising:
a display interface comprising the semiconductor device according to claim 7; and
a display panel.

18. An electronic device comprising:
the display module according to claim 17; and
an operation button.

* * * * *